(12) United States Patent
Sugimoto et al.

(10) Patent No.: US 7,719,012 B2
(45) Date of Patent: May 18, 2010

(54) LIGHT-EMITTING DEVICE AND IMAGE READING APPARATUS

(75) Inventors: Kunihito Sugimoto, Anan (JP); Naofumi Sumitani, Anan (JP); Masahide Wakisaka, Tokyo (JP)

(73) Assignees: Nippon Sheet Glass Company, Limited, Tokyo (JP); Nichia Corporation, Tokushima (JP)

( * ) Notice: Subject to any disclaimer, the term of this patent is extended or adjusted under 35 U.S.C. 154(b) by 507 days.

(21) Appl. No.: 11/388,827

(22) Filed: Mar. 24, 2006

(65) Prior Publication Data

US 2006/0214879 A1  Sep. 28, 2006

(30) Foreign Application Priority Data

Mar. 24, 2005  (JP)  ............................. 2005-086291

(51) Int. Cl.
*H01L 27/15* (2006.01)
*H01L 29/26* (2006.01)
*H01L 31/12* (2006.01)
*H01L 33/00* (2010.01)

(52) U.S. Cl. ......................... 257/79; 257/13; 257/103; 257/86; 257/E25.02; 257/E33.066

(58) Field of Classification Search .................. 257/13, 257/79–103, 919, E25.02, E33.066
See application file for complete search history.

(56) References Cited

U.S. PATENT DOCUMENTS

| 2003/0006430 | A1* | 1/2003 | Shibata et al. | 257/200 |
| 2004/0159850 | A1* | 8/2004 | Takenaka | 257/98 |
| 2005/0068776 | A1* | 3/2005 | Ge | 362/296 |
| 2005/0158687 | A1* | 7/2005 | Dahm | 433/29 |
| 2005/0231983 | A1* | 10/2005 | Dahm | 362/800 |
| 2006/0131591 | A1* | 6/2006 | Sumitani | 257/79 |

FOREIGN PATENT DOCUMENTS

| JP | 11-017231 | 1/1999 |
| JP | 11-136449 | 5/1999 |
| JP | 11-330557 | 11/1999 |

OTHER PUBLICATIONS

English translation of communication issue in related Chinese patent application No. 200610066107.1.

* cited by examiner

*Primary Examiner*—Zandra Smith
*Assistant Examiner*—Telly D Green
(74) *Attorney, Agent, or Firm*—Perkins Coie LLP

(57) ABSTRACT

A light-emitting device includes a light-emitting element and a light-guiding member for causing light from the light-emitting element entering into it through one surface thereof. The light-emitting element includes a lead member with a light-emitting element chip mounted thereon and a molded member to which the lead member is secured. The lead member has a metallic part extending from the molded member, and the metallic part is bent. The thus arranged light-emitting device has an excellent heat release capability. An image reading apparatus using the light-emitting device is also provided.

11 Claims, 20 Drawing Sheets

F I G . 3
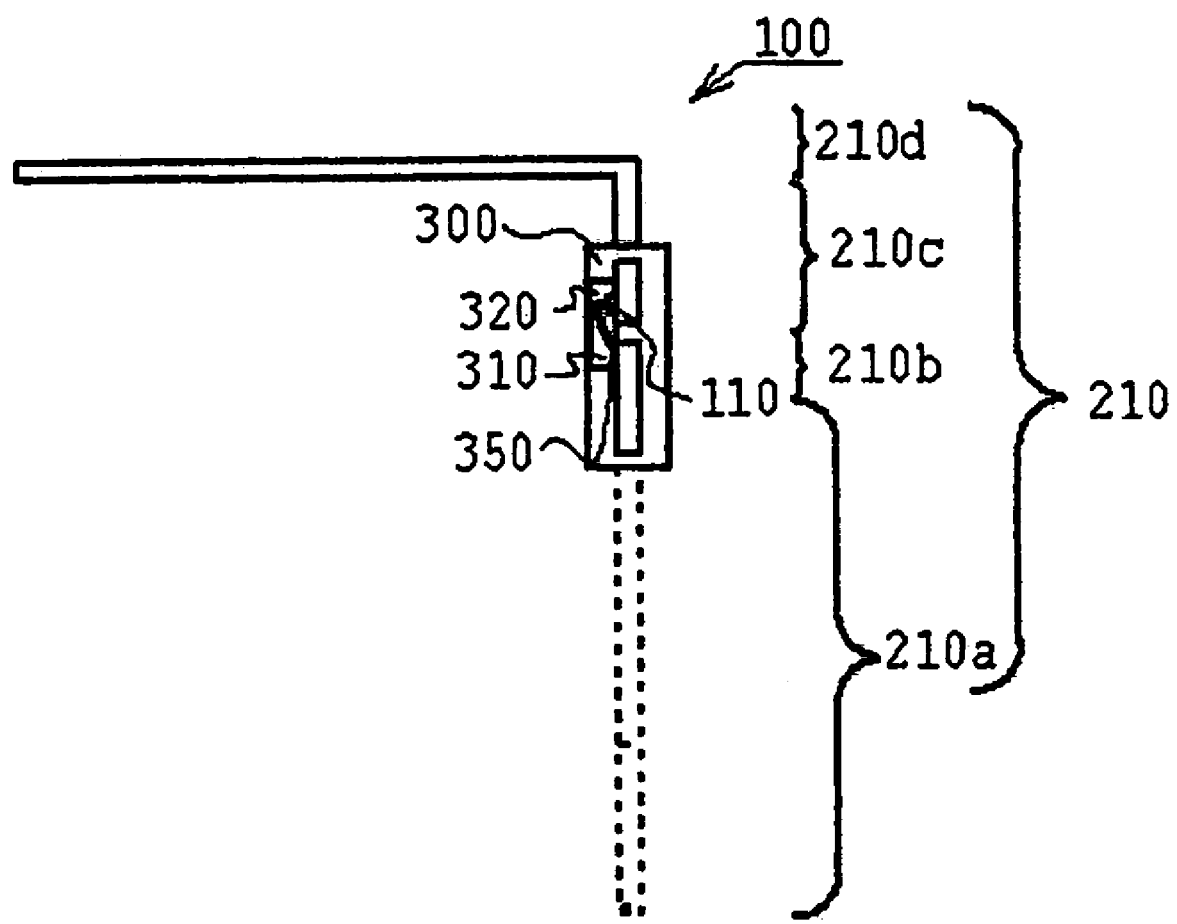

F I G . 4
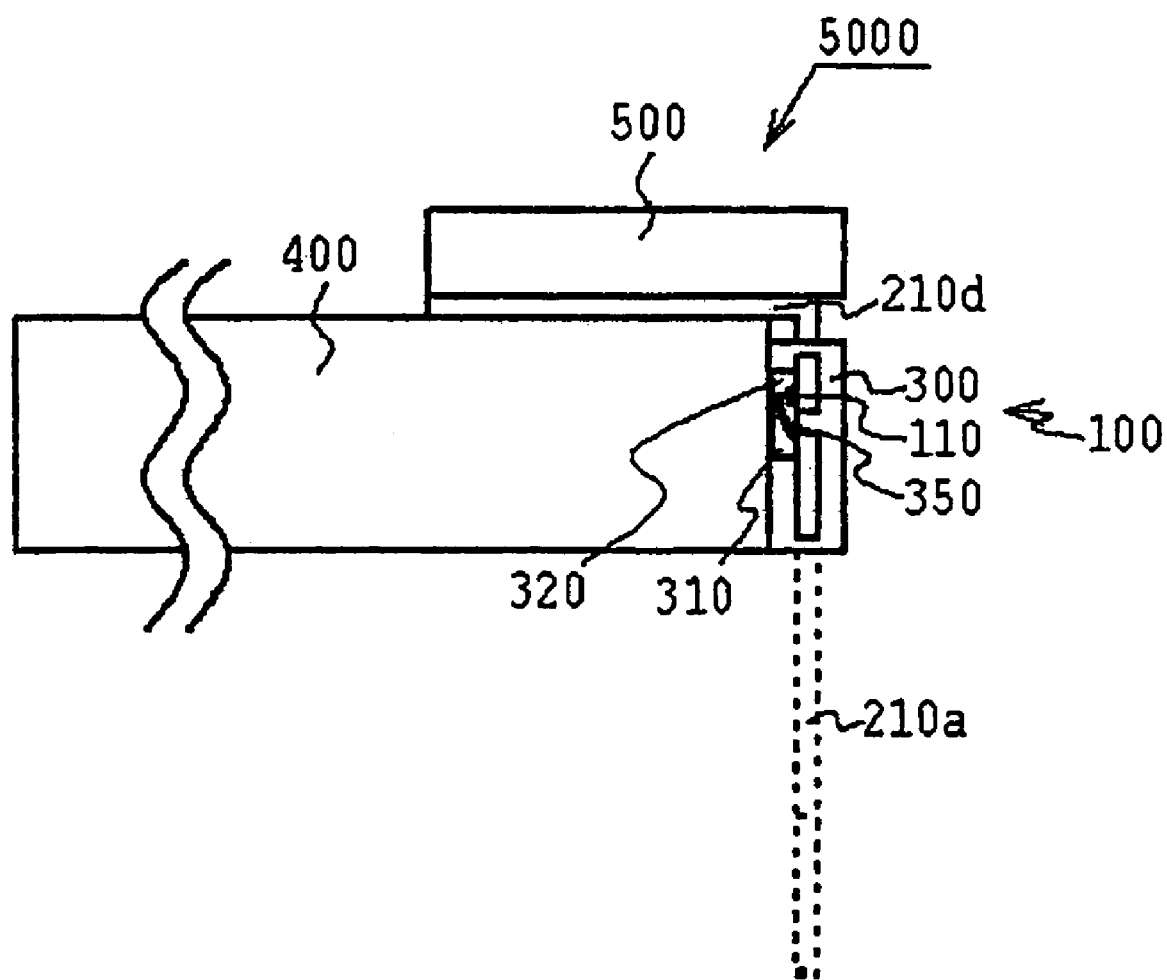

LIGHT-EMITTING DEVICE AND IMAGE READING APPARATUS

CROSS REFERENCE TO RELATED APPLICATION

This application claims priority from Japanese Patent Application No. 2005-086291, which is incorporated herein by reference.

BACKGROUND OF THE INVENTION

1. Field of the Invention

The present invention relates to a light-emitting device and an image reading apparatus.

2. Related Art

Hitherto, an image reading apparatus (a contact image sensor) is used as an apparatus for reading a document image or the like in a facsimile machine, a copy machine, an image scanner, etc. The image reading apparatus includes a light-emitting device that irradiates light linearly along the main-scanning direction onto a surface of a document, and this light-emitting device in turn includes a transparent light-guiding member having a bar- or plate-like shape with a longitudinal axis. Light incident onto an end surface of the transparent light-guiding member is reflected and transmitted therethrough, and emitted to the outside from an emission surface located along the longitudinal axis. A light-emitting device for use in such an image reading apparatus is illustrated in FIG. 20 (cf. for example, Japanese Patent Application Laid-open No. 1999-330557, page 6, FIG. 10), in which a light-emitting element 3000 is made up of a first lead member 3210, a second lead member 3221, a third lead member 3222, a fourth lead member 3223, and a molded member 3300 on which these lead members are fixedly mounted. A first semiconductor light-emitting element chip 3110, a second semiconductor light-emitting element chip 3120 and a third semiconductor light-emitting element chip 3130 (hereinafter referred to "semiconductor light-emitting element chips 3110, 3120, 3130") are mounted on the first lead member 3210. The first lead member 3210 has a lead terminal part 3210a for electrical connection to an outside electrode and a mounting part 3210b formed integrally with the lead terminal part 3210a, in which the semiconductor light-emitting element chips 3110, 3120, 3130 are mounted on the mounting part 3210b. The first semiconductor light-emitting element chip 3110 has a first electrode 3111 and a second electrode 3112. The first electrode 3111 and the second electrode 3112 are electrically connected to the first lead member 3210 and the second lead member 3221 by wire, respectively. The second semiconductor light-emitting element chip 3120 also has a first electrode 3121 and a second electrode 3122 that are electrically connected to the first lead member 3210 and the third lead member 3222 by wire, respectively. The third semiconductor light-emitting element chip 3130 also has a first electrode 3131 and a second electrode 3132, in which the second electrode 3132 is electrically connected to the fourth lead member 3223 by wire and the first electrode 3131 is electrically connected to the first lead member 3210 by a bonding material.

The above described conventional light-emitting element 3000 poses a problem in that heat generated from one of the three semiconductor light-emitting element chips, which all are mounted on the first lead member 3210, may break or damage the residual chips. This problem may be caused for example in a case in which an RGB light-emitting element is produced by using a GaN semiconductor light-emitting element chip that emits blue light for the first semiconductor light-emitting element chip 3110, a GaN semiconductor light-emitting element chip that emits green light for the second semiconductor light-emitting element chip 3120, and a semiconductor light-emitting element chip that emits red light for the third semiconductor light-emitting element chip 3130. The current flowing through the light-emitting element causes the first semiconductor light-emitting element chip 3110 and the second semiconductor light-emitting element chip 3120 to have a higher heat output than the third semiconductor light-emitting element chip 3130, which heat from these chips is transmitted to the third semiconductor light-emitting element chip 3130 via the first lead member 3210 and hence breaks or causes damages to the third semiconductor light-emitting element chip 3130. Especially, heat generated from the semiconductor light-emitting element chips must be taken into account, especially in a case where the light-emitting element is used as a light source for an image reading apparatus, for which a high powered light-emitting element is required.

Hence, it is an object of the present invention to provide a light-emitting device that has an excellent heat release capability and an image reading apparatus using the light-emitting device.

SUMMARY OF THE INVENTION

According to one aspect of the present invention, there is provided a light-emitting device that includes a light-emitting element and a light-guiding member for causing light from the light-emitting element entering into it through one surface thereof, in which the light-emitting element includes a lead member with a light-emitting element chip mounted thereon and a molded member to which the lead member is secured; the lead member has a metallic part extending from the molded member; and the metallic part is bent relative to the molded member.

More specifically, the light-emitting element includes: a semiconductor light-emitting element chip having a first electrode and a second electrode; a first lead member on which the semiconductor light-emitting element chip is mounted, said first lead member electrically connected to the first electrode of the semiconductor light-emitting element chip; a second lead member electrically connected to the second electrode of the semiconductor light-emitting element chip; and a molded member to which a portion of each of the first lead member and the second lead member is secured. The first lead member has a lead terminal part for electrical connection to an outside electrode, a mounting part through which the semiconductor light-emitting element chip is mounted on the first lead member, a metallic part for releasing heat generated from the semiconductor light-emitting element chip, and a connection part for connection between the mounting part and the metallic part. The lead terminal part, the mounting part, the connection part and the metallic part in the first lead member are arranged in this order. The connection part has a width smaller than the width of the metallic part. The metallic part has a surface area larger than the surface area of the molded member. The metallic part is made mainly of copper and bent close to the semiconductor light-emitting element chip at an angle between 45 degrees and 135 degrees relative to the molded member.

Herein, it is to be noted that the lead terminal part, the mounting part, the connection part and metallic part are not necessarily clearly defined by boundary lines or surfaces. By the metallic part is meant in this description a part extending upwards from the molded member. By the mounting part is meant a part located inside of the molded member so as to mount thereon the semiconductor light-emitting element chip. By the lead terminal part is meant a part extending over a terminal part, which extends downwards from the molded member, and the mounting part. By the connection part is meant a part between the metallic part and the mounting part. By the width of the connection part is meant a lateral distance of the connection part when the light-emitting element is viewed from the front. By the width of the metallic part is meant a lateral distance when the light-emitting element having a shape prior to be bent is viewed from the front.

In the present invention, the metallic part is held in contact with the light-guiding member and has a wave-like shape in cross section. With this arrangement, a surface area of the metallic part in a given region is increased so that heat releasing performance can be enhanced. The light-guiding member may have a portion having a shape matched with the wave-like shape of the metallic part so that the light-guiding member is more tightly held in contact with the metallic part, achieving more rigid connection therebetween.

The thus arranged light-emitting device having the light-emitting element can efficiently release heat generated from the semiconductor light-emitting element chip to the outside. The metallic part has a surface area larger than the surface area of the molded member, allowing itself to improve heat release capability and to be more securely mounted to a light-emitting device. The metallic part, which is made mainly of copper having a relatively high heat conductivity, can efficiently release heat generated from the semiconductor light-emitting element chip and transfer the same to the outside, thereby achieving improved heat release capability. The metallic part is bent close to the semiconductor light-emitting element chip at a certain angle so that the light-emitting element can be easily attached to a light-guiding member (hereinafter described) and hence light emitted from the light-emitting element can be efficiently guided to the light-guiding member, and the light-emitting device can be downsized.

In the above light-emitting element, it is preferable that the molded member has at least two different sides, from which the metallic part and the lead terminal part respectively extend outwards. With this arrangement, a heat releasing pathway can be set different from the lead terminal, and short circuiting between the metallic part and the lead terminal part can be prevented.

According to another aspect of the present invention, there is provided a light-emitting device that includes: a light-emitting element; and a light-guiding member for guiding and emitting therethrough light emitted from the light-emitting element and incident thereon by reflecting or transmitting a portion of the incident light through the light-guiding member. The light-emitting element includes a semiconductor light-emitting element chip having a first electrode and a second electrode, a first lead member on which the semiconductor light-emitting element chip is mounted, said first lead member electrically connected to the first electrode of the semiconductor light-emitting element chip, a second lead member electrically connected to the second electrode of the semiconductor light-emitting element chip, and a molded member to which a portion of each of the first lead member and the second lead member is secured. The first lead member has a lead terminal part for electrical connection to an outside electrode, a mounting part through which the semiconductor light-emitting element chip is mounted on the first lead member, a metallic part for releasing heat generated from the semiconductor light-emitting element chip, and a connection part for connection between the mounting part and the metallic part. The lead terminal part, the mounting part, the connection part and the metallic part in the first lead member are arranged in this order. The light-emitting element is secured to the light-guiding member with the metallic part held in contact with the light-guiding member.

With the above arrangement, heat generated from the semiconductor light-emitting element chip is conducted through the metallic part to the light-guiding member, through which the heat is released to the outside. Whereby, it is possible to release the heat remaining in the light-emitting element to the outside and thus preventing breakages or damages of the semiconductor light-emitting element chip due to heat. Especially, the enlarged surface area of the light-guiding member produces an excellent heat release capability.

In the above light-emitting device, it is preferable that the connection part has a width smaller than the width of the metallic part; the light-guiding member has a fitting part for fitting engagement with at least a portion of the light-emitting element; and the at least a portion of the light-emitting element is fitted in the fitting part. With this arrangement, it is possible to relatively easily bend the connection part, and have the metallic part bent at a certain angle so that it can be easily attached to the light-guiding member, and the light-guiding element can be more rigidly secured to the light-guiding member.

It is preferable that the light-emitting element has a light extraction section extending at least partly over the semiconductor light-emitting element chip so that light emitted from the semiconductor light-emitting element chip is extracted through the light extraction section, and the light extraction section tightly contacts the light-guiding member. With this arrangement, it is possible to efficiently guide light emitted from the semiconductor light-emitting element chip to the light-guiding member. That is, it is possible to provide a light-emitting device that reduces the light leakage between the light-guiding member and the light-emitting element, and hence emits uniform light with high output power.

The light-emitting device preferably further includes a heat release member jointed to the metallic part so that heat generated from the semiconductor light-emitting element chip is transmitted from the metallic part to the heat release member. Whereby, it is possible to provide a light-emitting device with enhanced heat releasing performance.

Preferably, the light-emitting element of the light-emitting device includes: a first semiconductor light-emitting element chip that has a peak wavelength in a short wavelength range of the visible spectrum and has a first electrode and a second electrode; a second semiconductor light-emitting element chip that has a peak wavelength in a long wavelength range of the visible spectrum and has a first electrode and a second electrode; a first lead member on which the first semiconductor light-emitting element chip is mounted, said first lead member electrically connected to the first electrode of the first semiconductor light-emitting element chip; a second lead member electrically connected to the second electrode of the first semiconductor light-emitting element chip; a third lead member on which the second semiconductor light-emitting element chip is mounted, said third lead member electrically connected to the first electrode of the second semiconductor light-emitting element chip; a fourth lead member electrically connected to the second electrode of the second semiconductor light-emitting element chip; and a molded member to which a portion of each of the first to fourth lead members is secured. The first lead member has a lead terminal part for electrical connection to an outside electrode, a mounting part through which the first semiconductor light-emitting element chip is mounted on the first lead member, a metallic part for releasing heat generated from the first semiconductor light-emitting element chip, and a connection part for connection between the mounting part and the metallic part. The lead terminal part, the mounting part, the connection part and the metallic part in the first lead member are arranged in this order. At least a portion of the connection part is exposed from the molded member.

In the above light-emitting element, the third lead member on which the second semiconductor light-emitting element chip is mounted is separately arranged from the first lead member on which the first semiconductor light-emitting element chip is mounted, so that heat generated from the first semiconductor light-emitting element chip is unlikely to be directly transferred to the second semiconductor light-emitting element chip. Thus, it is possible to limit the possibility of damage to the second semiconductor light-emitting element chip, as well as enhancing the heat releasing performance of the first semiconductor light-emitting element chip.

In the above light-emitting element, the second lead member is preferably formed integrally with the fourth lead member. Whereby, it is possible to reduce the number of leads and hence provide simplified circuitry. In addition, the light-emitting element can be reduced in size. It is to be noted that even in the integral arrangement, a corresponding part of it may be referred to as any one of the "second lead member" and the "fourth lead member".

According to yet another aspect of the present invention, there is provided a light-emitting device that includes the aforesaid light-emitting element, and a light-guiding member for guiding and emitting therethrough light emitted from the light-emitting element and incident thereon by reflecting or transmitting a portion of the incident light through the light-guiding member. The light-guiding member has a fitting part for fitting engagement with at least a portion of the light-emitting element, in which the at least a portion of the light-emitting element is fitted in the fitting part. With this arrangement, it is possible to provide a light-emitting device that can highly efficiently utilize light emitted from the light-emitting element, as well as enabling the light-emitting element to be rigidly secured to the light-guiding member.

It is preferable that the light-emitting element has a light extraction section extending at least partly over the semiconductor light-emitting element chips so that lights emitted from the semiconductor light-emitting element chips are extracted through the light extraction section, and the light extraction section tightly contacts the light-guiding member. With this arrangement, it is possible to efficiently guide light emitted from the semiconductor light-emitting element chip to the light-guiding member. That is, it is possible to provide a light-emitting device that reduces the light leakage between the light-guiding member and the light-emitting element, and hence emits uniform light with high output power.

The light-emitting device preferably further includes a heat release member jointed to the metallic part so that heat generated from the first semiconductor light-emitting element chip is transmitted from the metallic part to the heat release member. With this arrangement, it is possible to provide a light-emitting device with enhanced heat releasing performance.

The light-emitting element includes: a first semiconductor light-emitting element chip that has a peak wavelength in a short wavelength range of the visible spectrum and has a first electrode and a second electrode; a second semiconductor light-emitting element chip that has a peak wavelength in a wavelength range longer than the peak wavelength of the first semiconductor light-emitting element chip and has a first electrode and a second electrode; a third semiconductor light-emitting element chip that has a peak wavelength in a wavelength range longer than the peak wavelength of the second semiconductor light-emitting element chip and has a first electrode and a second electrode; a first lead member on which the first semiconductor light-emitting element chip is mounted, said first lead member electrically connected to the first electrode of the first semiconductor light-emitting element chip; a second lead member electrically connected to the second electrode of the first semiconductor light-emitting element chip; a third lead member on which the second semiconductor light-emitting element chip is mounted, said third lead member electrically connected to the first electrode of the second semiconductor light-emitting element chip; a fourth lead member electrically connected to the second electrode of the second semiconductor light-emitting element chip; a fifth lead member on which the third semiconductor light-emitting element chip is mounted, said third lead member electrically connected to the first electrode of the third semiconductor light-emitting element chip; a sixth lead member electrically connected to the second electrode of the third semiconductor light-emitting element chip; and a molded member to which a portion of each of the first to sixth lead members is secured. The first lead member has a first lead terminal part for electrical connection to an outside electrode, a first mounting part through which the first semiconductor light-emitting element chip is mounted on the first lead member, a first metallic part for releasing heat generated from the first semiconductor light-emitting element chip, and a first connection part for connection between the first mounting part and the first metallic part. The first lead terminal part, the first mounting part, the first connection part and the first metallic part in the first lead member are arranged in this order. The third lead member has a second lead terminal part for electrical connection to an outside electrode, a second mounting part through which the second semiconductor light-emitting element chip is mounted on the third lead member, a second metallic part for releasing heat generated from the second semiconductor light-emitting element chip, and a second connection part for connection between the second mounting part and the second metallic part. The second lead terminal part, the second mounting part, the second connection part and the second metallic part in the third lead member are arranged in this order. The first metallic part and the second metallic part extend outwards from the molded member.

In the thus arranged light-emitting element, the fifth lead member on which the third semiconductor light-emitting element chip is mounted, is separated from the first lead member and the third lead member on which the first semiconductor light-emitting element chip and the second semiconductor light-emitting element chip are respectively mounted, so that heat generated from the first and second semiconductor light-emitting element chips is unlikely to be directly transferred to the third semiconductor light-emitting element chip. Thus, it is possible to limit the possibility of damage to the first semiconductor light-emitting element chip, the second semiconductor light-emitting element chip and the third semiconductor light-emitting element chip due to heat, as well as enhancing the heat releasing performances of the first semiconductor light-emitting element chip and the second semiconductor light-emitting element chip.

In the above light-emitting element, it is preferable that the molded member has a first side and a second side, in which the first and second metallic parts extend outwards from the first side, and the first and second lead terminal parts extend outwards from the second side. With this arrangement, a heat releasing pathway can be set different from the lead terminal, and short circuiting between the metallic part and the lead terminal part can be prevented.

It is also preferable that the first semiconductor light-emitting chip emits blue light, the second semiconductor light-emitting chip emits green light, and the third semiconductor light-emitting chip emits red light. Whereby, it is possible to provide a light-emitting element that emits light of various colors such as white. Especially, it is possible to make the light-emitting device appropriate as a light source for an image reading apparatus by modulating the three color light beams.

It is preferable that at least two of the second lead member, the fourth lead member and the sixth lead member are formed integrally with each other. With this integral arrangement, it is possible to reduce the number of leads and hence provide simplified circuitry. In addition, the light-emitting element can be reduced in size. These advantages are apparent in such a case where the first lead member, the third lead member and the fifth lead member are functioned as anode electrodes, while the second lead member, the fourth lead member and the sixth lead member are functioned as a common cathode electrode. It is to be noted that even in the integral arrangement, a corresponding part of it may be referred as any one of the "second lead member", the "fourth lead member" and the "sixth lead member".

According to still another aspect of the present invention, there is provided a light-emitting device that includes the aforesaid light-emitting element and a light-guiding member for guiding and emitting therethrough light emitted from the light-emitting element and incident thereon by reflection or transmitting a portion of the incident light through the light-guiding member, the light-guiding member having a fitting part for fitting engagement with at least a portion of the light-emitting element, wherein the at least a portion of the light-emitting element is fitted in the fitting part. With this arrangement, it is possible to provide a light-emitting device that can highly efficiently utilize light emitted from the light-emitting element, as well as enabling the light-emitting element to be rigidly secured to the light-guiding member.

It is preferable that the light-emitting element has a light extraction section extending at least partly over the first to third semiconductor light-emitting element chips so that lights emitted from the first to third semiconductor light-emitting element chips are extracted through the light extraction section, and the light extraction section tightly contacts the light-guiding member. With this arrangement, it is possible to efficiently guide light emitted from the semiconductor light-emitting element chip to the light-guiding member.

The light-emitting device preferably further includes heat release members respectively jointed to the first metallic part and the second metallic part so that heat generated from each of the first semiconductor light-emitting element chip and the second semiconductor light-emitting element chip is transmitted from the corresponding metallic part to the corresponding heat release member. With this arrangement, it is possible to provide a light-emitting device with enhanced heat releasing performance.

According to another aspect of the present invention, there is provided an image reading apparatus that includes a light-emitting device for emitting light onto a reading object, a line image sensor, and a lens array for focusing light from the light-emitting device, which light turns into reflection light or transmitted light from the reading object, onto the line image sensor, the light-emitting device including a light-emitting element and a light-guiding member for causing light from the light-emitting element entering into it through one surface thereof, in which the light-emitting element includes a lead member with a light-emitting element chip mounted thereon and a molded member to which the lead member is secured; the lead member has a metallic part extending from the molded member; and the metallic part is bent. Or, the metallic part is held in contact with the light-guiding member and has a wave-like shape in cross section.

With the above arrangement, a surface area of the metallic part in a given region is increased so that heat releasing performance can be enhanced. The light-guiding member may have a portion having a shape matched with the wave-like shape of the metallic part so that the light-guiding member is more tightly held in contact with the metallic part, providing an image reading apparatus with small size.

BRIEF DESCRIPTION OF THE DRAWINGS

The above, and other objects, features and advantages of the present invention will become apparent from the detailed description thereof in conjunction with the accompanying drawings wherein.

FIG. 3 is a schematic cross sectional view of a light-emitting element according to the first embodiment of the present invention.

FIG. 4 is a schematic cross sectional view of a light-emitting device according to a second embodiment of the present invention.

DETAILED DESCRIPTION OF THE PREFERRED EMBODIMENT

Figure 1:
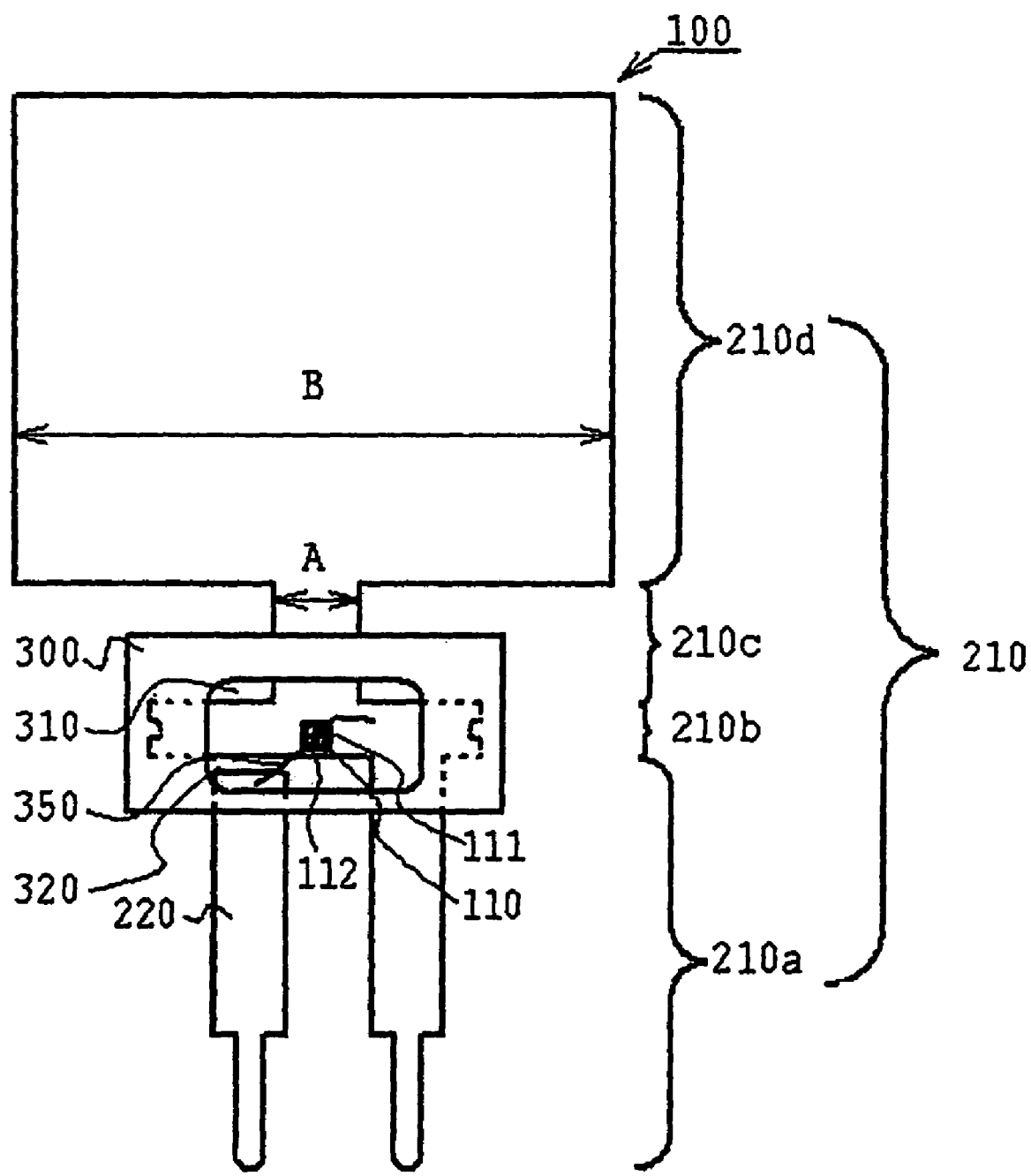
FIG. 1 is a schematic plan view of a light-emitting element according to a first embodiment of the present invention.

Now, the description will be made for a light-emitting device according to preferred embodiments of the present invention, in conjunction with a light-emitting element and a process of manufacturing the same, with reference to the drawings attached hereto. It is to be noted that the scope of the present invention is not limited to or by the following embodiments and examples.

Some members or parts and positional relationship of members or pars in the drawings are enlarged for clear illustration. The same or equivalent members or parts are given the same name or allocated the same reference numerals so as to omit the detailed description for them.

First Embodiment

Light-Emitting Element

Figure 2:
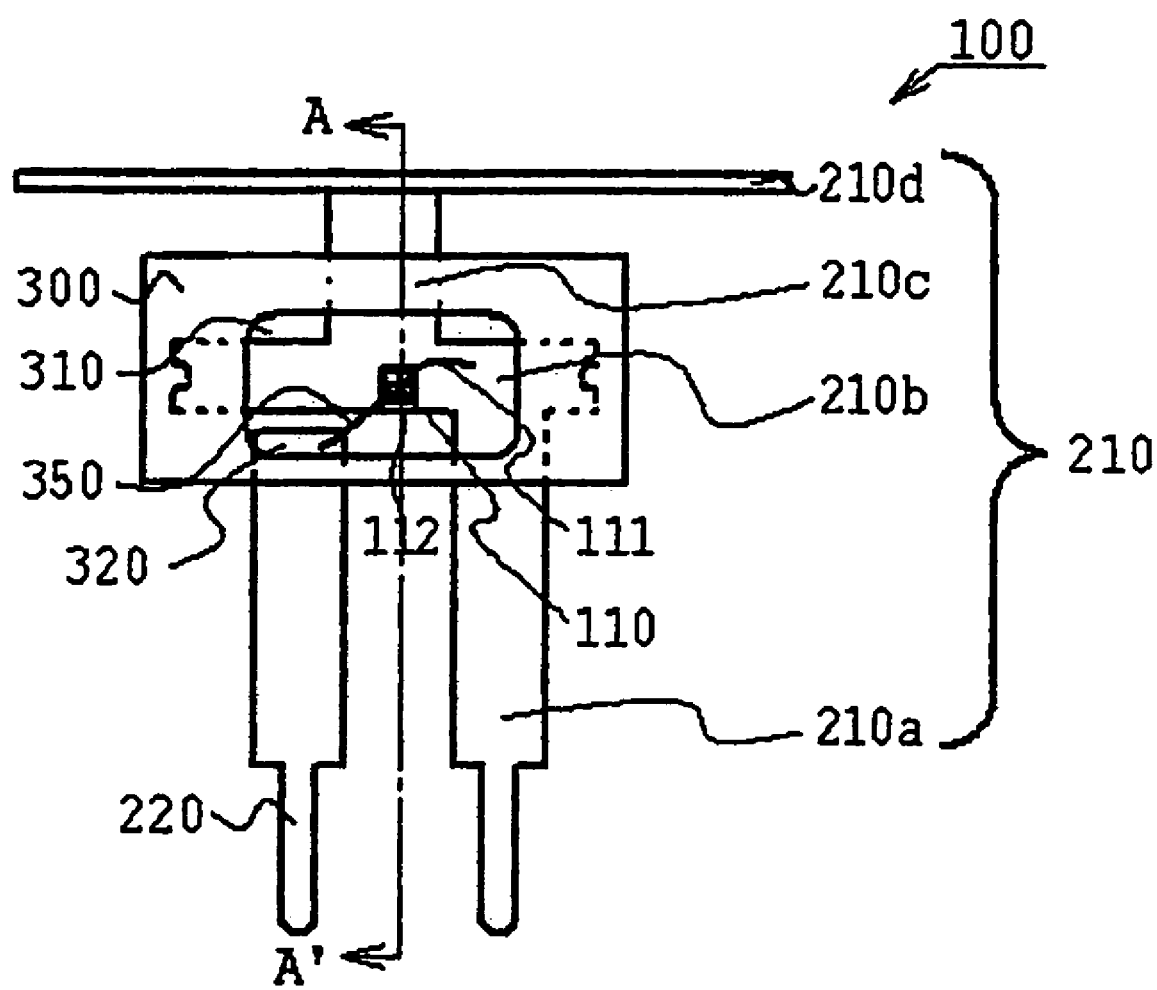
FIG. 2 is a schematic plan view of a light-emitting element according to the first embodiment of the present invention.

Now, the description will be made for a light-emitting element according to the first embodiment. FIG. 1 is a schematic plan view illustrating the light-emitting element of the first embodiment. FIG. 2 is a schematic plan view with a portion enlarged, which illustrates the light-emitting element of the first embodiment. FIG. 3 is a schematic cross sectional view (a sectional view taken along a line A-A in FIG. 2) according to the first embodiment. Specifically, FIG. 1 illustrates the light-emitting element before it is mounted to a light-emitting device, and FIGS. 2 and 3 each illustrate the light-emitting element having lead members bent when it is to be mounted to the light-emitting device.

A light-emitting element 100 of the first embodiment includes a semiconductor light-emitting element chip 110, a first lead member 210, a second lead member 220, and a molded member 300 on which the first lead member 210 and the second lead member 220 are fixedly mounted. The semiconductor light-emitting element chip 110 is mounted on the first lead member 210 and is electrically connected to the same. The second lead member 220 is electrically connected to the semiconductor light-emitting element chip 110.

The first lead member 210 includes a lead terminal part 210a for electrical connection to an outside electrode, a mounting part 210b for mounting thereon the semiconductor light-emitting element chip 110, a metallic part 210d extending outwards from the molded member 300 and a connection part 210c for connection between the metallic part 210d and the mounting part 210b. The lead terminal part 210a and the metallic part 210d oppositely extend outwards from the molded member 300. The lead terminal part 210a, the mounting part 210b, the connection part 210c and the metallic part 210d in the first lead member 210 are arranged in this order. The lead terminal part 210a, which is formed integrally with the mounting part 210b, the connection part 210c and the metallic part 210d in this embodiment, may be formed separately therefrom and combined together when in use. A width A of the connection part 210c, which is smaller than a width B of the metallic part 210d, may be sized to be substantially equal to the same with a clearance or cutout in the connection part 210c along its surface center. This width setting with or without forming clearance or cutout is intended to make the metallic part 210d easy to be bent. The connection part 210c preferably has at least a portion disposed outside of the molded member 300. With this, the connection part 210c has a portion exposed from the molded member 300, which can be bent to be inclined. The metallic part 210d has a surface area larger than the surface area of the molded member 300. By this surface area is meant a dimension or size of the surface when the metallic part 210d and the molded member 300 are seen as a whole, without taking into account a small surface roughness or unevenness. The metallic part 210d is made of copper or an alloy containing copper as a main component because of a relatively high heat conductivity of copper than other metals. The metallic part 210d may have plural metal layers, such as a copper layer, and a silver layer and an aluminium layer, which are formed on the copper layer as a reflecting member. The reflecting member may be formed on the copper layer by plating. In this embodiment, the metallic part 210d has a rectangular shape but may have such a shape as to allow itself to be easily mounted to a light-guiding member. The first lead member 210 has an uneven surface, providing an anchoring effect for preventing the first lead member 210 from being pulled out or separated from the molded member 300.

The semiconductor light-emitting element chip 110 is secured to the mounting part 210b of the first lead member 210 by a die bonding material. The semiconductor light-emitting element chip 110 has on its one side a pair of positive and negative electrodes, i.e., a first electrode 111 and a second electrode 112 that are respectively electrically connected by wire 350 to the first lead member 210 and the second lead member 220, these lead members being disposed corresponding to the first electrode 111 and the second electrode 112.

The molded member 300 has a window 310 as an example of a light extraction section for extraction of light from the semiconductor light-emitting element chip 110. The window 310 has a recess having a bottom surface and a side surface, in which the bottom surface provides the mounting part 210b. A seal member 320 is filled in the recess of the window 310 so as to protect the semiconductor light-emitting element chip 110 from water, dusts or other foreign matters or external environment. Now, the description will be made for the respective members, parts, etc.

(Semiconductor Light-Emitting Element Chip)

The semiconductor light-emitting element chip 110 has a substrate and a semiconductor layer of GaAlN, ZnO, ZnS, ZnSe, SiC, GaP, GaAlAs, AlN, InN, AlInGaP, InGaN, GaN, AlInGaN or the like, which layer being provided as a light-emitting layer. The semiconductor may be of a homo-structure, a hetero-structure or a double-hetero-structure including an MIS junction, PIN junction or PN junction. The semiconductor makes it possible to selectively cover the wavelength range of emitted light extending from the ultraviolet to the infrared depending on the material of the semiconductor layer or its mixed crystal ratio. The light-emitting layer may be of a single quantum well structure or a multiple quantum well structure in the form of a thin-film, which provides a quantum effect.

A nitride-gallium compound semiconductor is preferably used as a semiconductor material that enables the semiconductor light-emitting element chip 110 to have a high brightness, and for red, it is preferable to use a gallium-aluminium-arsenic semiconductor or an aluminium-indium-gallium-phosphide semiconductor, while it is possible to use various types of semiconductors according to the intended use.

In a case where a nitride-gallium compound semiconductor is used, a material of such as sapphire, spinel, SiC, Si, ZnO or GaN single crystals is used for a semiconductor substrate. It is preferable to use a sapphire substrate to mass-produce the nitride semiconductors with superior crystallinity. In one example of the semiconductor light-emitting element chip using the nitride-gallium compound semiconductor, a buffer layer of GaN, AlN or the like is formed on a sapphire substrate, and then a first contact layer of n-type or p-type GaN, an active layer of an InGaN thin film which provides a quantum effect, a cladding layer of p-type or n-type AlGaN, and a second contact layer of p-type or n-type GaN are formed thereon in this order. The nitride-gallium compound semiconductor shows n-type conductivity without doping impurities. It is preferable to appropriately dope with an n-type dopant such as Si, Ge, Se, Te, and C to form a desired n-type nitride-gallium semiconductor for the purpose of improving light emission efficiency of the light-emission or the like reason.

On the other hand, when the desired p-type nitride-gallium semiconductor is to be formed, Zn, Mg, Be, Ca, Sr, Ba, etc. may be doped as p-type dopants. It is difficult to make the nitride-gallium semiconductor be a p-type semiconductor in a case where a p-type dopant is merely doped, and therefore it is necessary to carry out annealing by heating in a furnace, irradiation with a low energy electron, irradiation of plasma or the like so as to make the nitride-gallium semiconductor be the p-type semiconductor. A semiconductor wafer thus formed is partially etched to form a positive electrode and a negative electrode, and then cut into pieces each having a desired size to provide the semiconductor light-emitting element chip 110.

Plural semiconductor light-emitting element chips 110 may be used according to needs and circumstances, so that a specific combination thereof may achieve improved color mixture on a white background. For example, it is possible to employ a combination of a single semiconductor light-emitting element chip capable of emitting green light, a single semiconductor light-emitting element chip capable of emitting blue light and a single semiconductor light-emitting element chip capable of emitting red light. When used as a light-emitting element for an image reading apparatus, it is preferable to have a wavelength range of 610 nm to 700 nm for red light, a wavelength range of 495 nm to 565 nm for green light and a wavelength range of 430 nm to 490 nm for blue light. In order to have the light emitting element emit white mixed-color light by using a fluorescent material, the wavelength of light emitted by the light-emitting element is set preferably within a range from 400 nm to 530 nm and more preferably within a range from 420 nm to 490 nm in consideration of the relationship of complementary color with the emission wavelength from the fluorescent material and a possible deterioration of a light transmitting resin. In order to further improve the excitation efficiency between the semiconductor light-emitting element chip and the fluorescent material and light emission efficiency of the light-emitting element, it is more preferable to set the wavelength of light within a range from 450 nm to 475 nm. It is also possible to employ a semiconductor light-emitting element chip with a main emission wavelength in ultraviolet region of a wavelength shorter than 400 nm or in short wavelength region of visible light, in combination with a material that is relatively hard to be deteriorated by ultraviolet rays.

(Lead Members)

Although copper or an alloy containing copper as a main component is used for the first lead member 210 and the second lead member 220, it is possible to use iron, silver, gold, aluminium or other good conductors of electricity, as well. Copper or an alloy containing copper as a main component, which has a relatively high thermal conductivity, can efficiently conduct heat generated from the semiconductor light-emitting element chip 110 to the metallic part 210d. It is preferable to provide a reflecting member to a portion of the first lead member 210 and to a portion of the second lead member 220, which portions are located on the bottom surface of the window 310, on which the semiconductor light-emitting element chip 110 is mounted. With this reflecting member, light from the semiconductor light-emitting element chip 110 can be efficiently emitted towards the front. The reflecting member is preferably made of a material, such as silver, gold or aluminium, those having a high reflectivity against light emitted from the semiconductor light-emitting element chip 110. It is possible to enhance the reflectivity by enlarging the surface area of the mounting part 210b in the window 310. It is also possible to limit the temperature rise of the semiconductor light-emitting element chip 110 by enlarging the surface area of the mounting part 210b of the first lead member 210. With this, it is possible to apply a relatively great amount of electric current to the semiconductor light-emitting element chip 110. Furthermore, the mounting part 210b of the first lead member 210 is formed to have a width or lateral distance (when the light emitting element is viewed from the front in FIG. 1, etc) enlarged corresponding to the size of the molded member 300.

The first lead member 210 comprises an integral arrangement of the lead terminal part 210a, the metallic part 210d and the parts therebetween in this embodiment, while it is possible to use the first lead member 210 that has the lead terminal part 210a and the mounting part 210b integrally made of a certain material, and the mounting part 210b, the connection part 210c and the metallic part 210d integrally made of a material different from the certain material, and these joined together. When using the different materials, a material having a good electric conductivity is used for the lead terminal part 210a and parts on its side, while a material having a good thermal conductivity is used for the metallic part 210d and parts on its side. When a lead member is to be integrally formed, a metal plate is punched out into a given lead frame by using such as a press machine. When a lead member is to be formed from different materials, different metal plates are respectively punched out into pieces having different sizes, which are then secured to each other by welding or the like technique.

(Molded Member)

The molded member 300 is designed to secure the first lead member 210 and the second lead member 220 in position. The molded member 300 is preferably made of BT resin or ceramics, while it may be made of epoxy resin, silicone resin, modified epoxy resin, modified silicone resin or the like. A filler such as titanium oxide or glass fiber may be mixed into a material of the molded member 300. The color of the molded member 300 is preferably white in order to efficiently emit light, which has been emitted from the semiconductor light-emitting element chip 110, towards the front, while it is possible to form a black film on the surface of the molded member 300 to limit the reflection of light.

As described above, the molded member 300 has the window 310, which forms a recess with a bottom surface and a side surface. The first lead member 210 and the second lead member 220 are disposed on the bottom surface of the recess. The semiconductor light-emitting element chip 110 is disposed on the mounting part 210b of the first lead member 210. The window 310 may be formed into various shapes such as rectangular, elliptical or rounded shape, as viewed from the front.

(Seal Member)

The seal member 320 is disposed in the window 310 of the molded member 300 to protect the semiconductor light-emitting element chip 110 and the wire 350 from an external force, water or other foreign matters or external environment, as well as to efficiently transmit light of the semiconductor light-emitting element chip 110 to the outside. Examples of the material to be appropriately used for the seal member 320 include transparent resin having excellent thermal resistance and weather resistance such as epoxy resin, silicone resin, modified epoxy resin, modified silicone resin, urea resin and polyamide, and glass. In a case where plural semiconductor light-emitting element chips 110 are disposed with high density, or the semiconductor light-emitting element chip 110 has a light emission output of high light intensity, it is more preferable to use epoxy resin, silicone resin, etc., solely or in combination thereof in view of potential breakage of wire or the like due to thermal shock. The seal member 320 may contain a light diffusion agent such as barium titanate, titanium oxide, aluminium oxide or silicon oxide. For the purpose of cutting-off wavelengths other than the wavelength of interest, an organic or inorganic colored dye or pigment may be added. Furthermore, a fluorescent material may be added to convert at least part of the light emitted from the semiconductor light-emitting element chip 110 into a light having a different wavelength.

(Process of Manufacturing a Light-Emitting Element)

For manufacturing a light-emitting element, a lead frame processed into a predetermined shape is used. This lead frame is clamped by an upper die and a lower die, and a predetermined resin (a molding member) is cast thereinto and cured to have the molded member 300. The upper and lower dies are then removed and a lead frame is taken out. The semiconductor light-emitting element chip 110 is then secured to this lead frame via a die bonding material. Electrical connections by wire are made respectively between the first electrode 111 of the semiconductor light-emitting element chip 110 and the first lead member 210 and between the second electrode 112 and the second lead member 220. The seal member 320 is then poured into the window 310 provided in the molded member 300 and cured. Finally, the first lead member 210 and the second lead member 220 are cut out of the lead frame to have the light-emitting element 100.

It is to be noted that the light-emitting element of the first embodiment is not necessarily manufactured by the above process, but can be manufactured by a different process.

Second Embodiment

Now, the description will be made for a light-emitting device according to the second embodiment with reference to the drawings attached hereto. FIG. 4 is a schematic cross sectional view illustrating the light-emitting device of the second embodiment. The detailed description for the members, parts and the like equivalent or corresponding to those of the light-emitting element of the first embodiment will be omitted.

(Light-Emitting Device)

A light-emitting device 5000 includes a light-guiding member 400 having an end portion, to which the light-emitting element 100 is attached through the side in which the window 310 is formed. Light emitted from the light-emitting element 100 is incident onto the light-guiding member 400 through its end portion, repeatedly reflected and transmitted through the light-guiding member 400 and emitted to the outside in the lengthwise direction of the light-guiding member 400. Light may be emitted in one direction by changing the size (diameter), shape or material of the light-guiding member 400. The metallic part 210d of the light-emitting element 100 is bent about 90 degrees relative to the molded member 300 so as to contact the light-guiding member 400. As the shape of the light-guiding member 400 is changed, the bending angle of this metallic part 210d is changed so as to keep the contacting engagement with the light-guiding member 400.

(Light-Guiding Member)

The light-guiding member 400 may be made of glass, polycarbonate, polymethyl methacrylate, acryl, etc. The light-guiding member 400 is designed to emit light in predetermined two directions by providing recesses, protrusions or cutouts at predetermined positions.

(Heat Release Member)

A heat release member 500 is joined to the metallic part 210d by welding or the like. The heat release member 500 is preferably made of Kovar, iron, copper, silver, rhodium, aluminium or gold. Kovar is an alloy of Fe—Ni—Co. The heat release member 500 preferably has an enlarged surface area contacting the metallic part 210d for efficient heat release, and therefore preferably has an enlarged bottom surface. The heat release member 500 may be joined to any one(s) of the other members.

Third Embodiment

Figure 5:
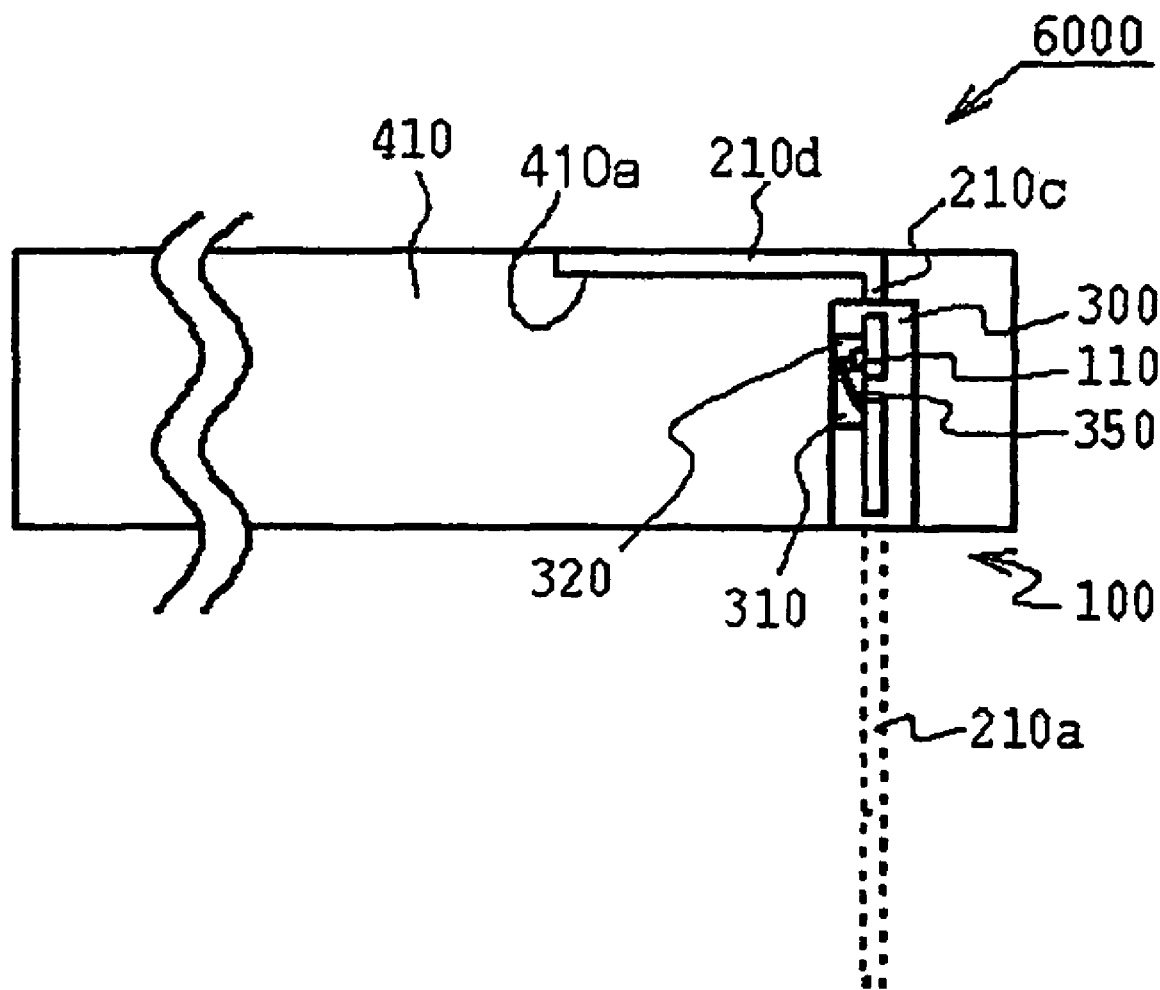
FIG. 5 is a schematic cross sectional view of a light-emitting device according to a third embodiment of the present invention.
Figure 6:
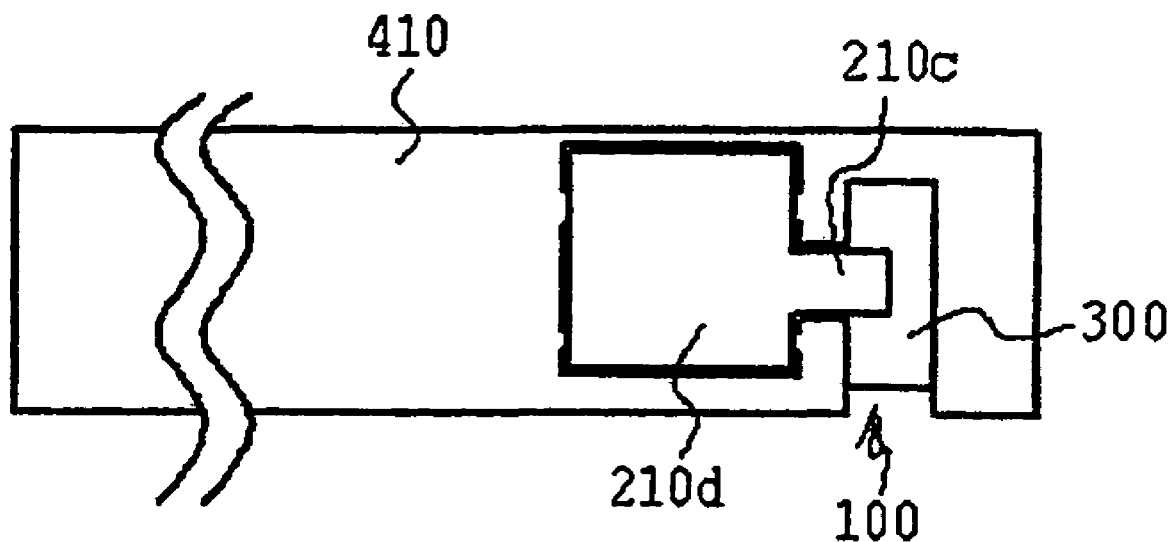
FIG. 6 is a schematic top view of a light-emitting device according to a third embodiment of the present invention.

Now, the description will be made for a light-emitting device according to the third embodiment with reference to the drawings attached hereto. FIG. 5 is a schematic cross sectional view illustrating the light-emitting device of the third embodiment. FIG. 6 is a schematic top view illustrating the light-emitting device of the third embodiment. The detailed description for the members, parts and the like equivalent or corresponding to those of the light-emitting element of the first embodiment and the light-emitting device of the second embodiment will be omitted.

A light-emitting device 6000 has a light-guiding member 410, to which the light-emitting element 100 is attached. The light-guiding member 410 has a fitting part 410a, in which the molded member 300 and the metallic part 210d, of the light-emitting element 100 are to be fitted. The molded member 300 and the metallic part 210d, of the light-emitting element 100 are fitted in this fitting part 410a so as to achieve contact between the metallic part 210d and the light-guiding member 410. The fitting part 410a of the light-guiding member 410 is arranged so as to prevent the metallic part 210d from being pulled out or separated therefrom.

Fourth Embodiment

Figure 7:
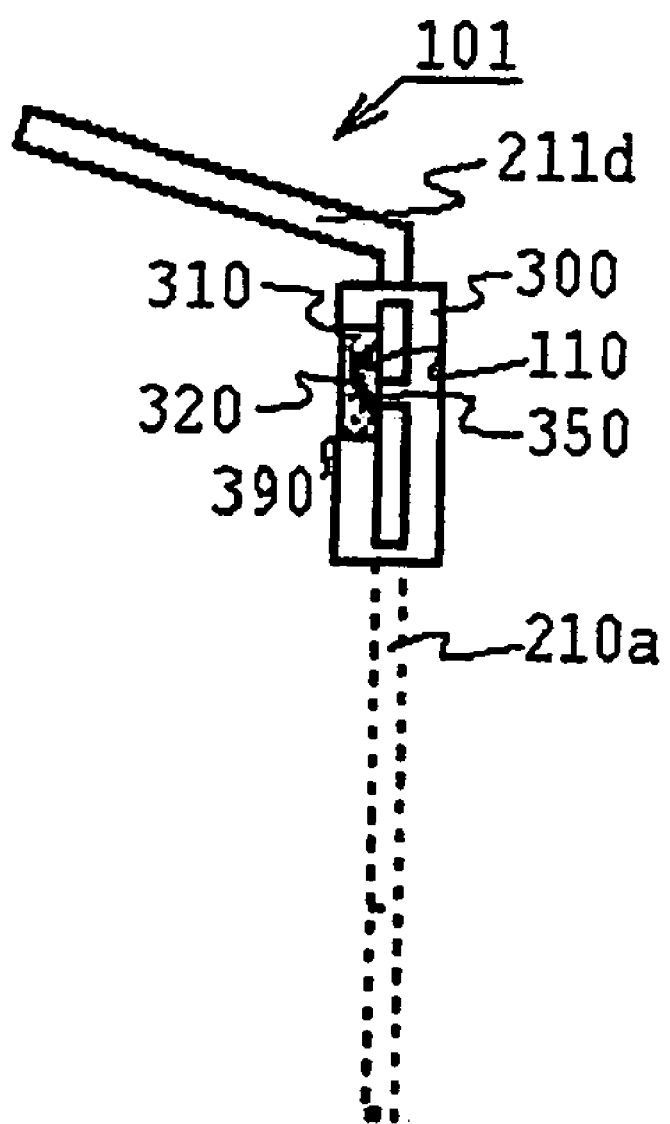
FIG. 7 is a schematic cross sectional view of a light-emitting device according to a fourth embodiment of the present invention.

Now, the description will be made for a light-emitting device according to the forth embodiment with reference to the drawings attached hereto. FIG. 7 is a schematic cross sectional view illustrating a light-emitting element of the fourth embodiment. The detailed description for the members, parts and the like equivalent or corresponding to those of the light-emitting element of the first embodiment will be omitted.

A light-emitting element 101 has a metallic part 211d bent at an obtuse angle so as to transmit light to the light-guiding member while preventing interference of light emitted from the semiconductor light-emitting element chip 110. In a case where a light-guiding member has a size or diameter larger than the molded member 300 of the light-emitting element 101, the attaching position of the molded member 300 to the light-guiding member can be appropriately changed. The seal member 320 disposed in the window 310 of the light-emitting element 101 contains a fluorescent material 390. It is possible to provide the light-emitting element 101 having various hues by an appropriate combination of the semiconductor light-emitting element chip 110 and a fluorescent material.

(Fluorescent Material)

Various fluorescent materials may be used, provided that a material can absorb light emitted from a semiconductor light-emitting element chip and convert the light into light having a different wavelength. A fluorescent material is preferably a nitride-based fluorescent material or an oxynitride-based fluorescent material activated mainly by lanthanoid element such as Eu and Ce, alkaline earth metal halogen apatite fluorescent material, alkaline earth metal boric acid halide salt fluorescent material, alkaline earth metal aluminate fluorescent material, silicate of alkali earth element, sulfide of alkaline earth element, alkaline earth thiogallate, alkaline earth silicon nitride or germanate that is activated mainly by lanthanoid element such as Eu or transition metal such as Mn, or rare earth aluminate or rare earth silicate activated mainly by lanthanoid element such as Ce, or at least one kind selected from organic material and organic complex activated mainly by lanthanoid element such as Eu. The followings are examples of the fluorescent materials to be used, to which the present invention is not necessarily limited.

Examples of nitride-based fluorescent materials activated mainly by lanthanoid element such as Eu and Ce include $M_2Si_5N_8$:Eu (M is at least one kind selected from among Sr, Ca, Ba, Mg and Zn), $M_2Si_5N_8$:Eu, $MSi_7N_{10}$:Eu, $M_{1.8}Si_5O_{0.2}N_8$:Eu, and $M_{0.9}Si_7O_{0.1}N_{10}$:Eu (M is at least one kind selected from among Sr, Ca, Ba, Mg and Zn).

Examples of oxynitride-based fluorescent materials activated mainly by lanthanoid element such as Eu and Ce include $MSi_2O_2N_2$:Eu (M is at least one kind selected from among Sr, Ca, Ba, Mg and Zn).

Examples of alkaline earth halogen apatite fluorescent materials activated mainly by lanthanoid element such as Eu or transition metal element such as Mn include $M_5(PO_4)_3X$:R (M is at least one kind selected from among Sr, Ca, Ba, Mg and Zn; X is at least one kind selected from among F, Cl, Br and I; and R is at least one kind selected from among Eu, Mn and combination of Eu and Mn).

Examples of alkaline earth metal boric acid halide salt fluorescent materials include $M_2B_5O_9X$:R (M is at least one kind selected from among Sr, Ca, Ba, Mg and Zn; X is at least one kind selected from among F, Cl, Br and I; and R is at least one kind selected from among Eu, Mn and combination of Eu and Mn).

Examples of alkaline earth metal aluminate fluorescent materials include $SrAl_2O_4$:R, $Sr_4Al_{14}O_{25}$:R, $CaAl_2O_4$:R, $BaMg_2Al_{16}O_{27}$:R, $BaMg_2Al_6O_{12}$:R and $BaMgAl_{10}O_{17}$:R (R is at least one kind selected from among Eu, Mn and combination of Eu and Mn).

Examples of alkaline earth sulfide fluorescent materials include $La_2O_2S$:Eu, $Y_2O_2S$:Eu and $Gd_2O_2S$:Eu.

Examples of rare earth aluminate fluorescent materials activated mainly by lanthanoid element such as Ce include YAG fluorescent materials having a structure represented by formulae $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, $(Y,Gd)_3(Al,Ga)_5O_{12}$, and $Tb_3Al_5O_{12}$:Ce and $Lu_3Al_5O_{12}$:Ce with part or all of Y substituted by Tb or Lu.

Examples of other fluorescent materials include ZnS:Eu, $Zn_2GeO_4$:Mn, $MGa_2S_4$:Eu (M is at least one kind selected from among Sr, Ca, Ba, Mg and Zn; X is at least one kind selected from among F, Cl, Br and I).

The aforesaid fluorescent materials may include, instead of, or in addition to Eu, at least one kind selected from among Tb, Cu, Ag, Au, Cr, Nd, Dy, Co, Ni and Ti.

Other than those described above, fluorescent materials having similar properties and effects may also be used. For these fluorescent materials, such fluorescent materials having emission spectra in yellow, red, green and blue regions and those having emission spectra in intermediate colors of yellow, blue-green and orange regions, when they are irradiated with an exciting light of a semiconductor light-emitting element chip, may also be used. It is possible to manufacture a light-emitting device that emits light of various colors by using these fluorescent materials in various combinations.

For example, wavelength conversion is achieved by irradiating a YAG fluorescent material of $Y_3Al_5O_{12}$:Ce or $(Y_{0.8}Gd_{0.2})_3Al_5O_{12}$:Ce, using a GaN compound semiconductor light-emitting element chip that emits blue light, so that a mixed color is created by the light from the semiconductor light-emitting element chip and the light from the YAG fluorescent material. Thus, a light-emitting device that provides white emission can be produced.

For example, it is possible to provide a light-emitting device that provides white emission with a good color rendering by using the light of a GaN compound semiconductor light-emitting element chip that has a peak wavelength in the ultraviolet region. Specifically, the light from this GaN compound semiconductor light-emitting element chip is irradiated to a fluorescent material of a mixture of $CaSi_2O_2N_2$:Eu or $SrSi_2O_2N_2$ that emits light in green to yellow region, (Sr, Ca)$_5$(PO$_4$)$_3$Cl:Eu that emits light in blue region and (Ca,Sr)$_2$Si$_5$N$_8$:Eu that emits light in red region, and absorbed therein. Thus, desirable white emission can be achieved only by changing the component ratio in the mixing of the fluorescent material through the utilization of the three primary colors: red, blue and green.

Fifth Embodiment

Figure 8:
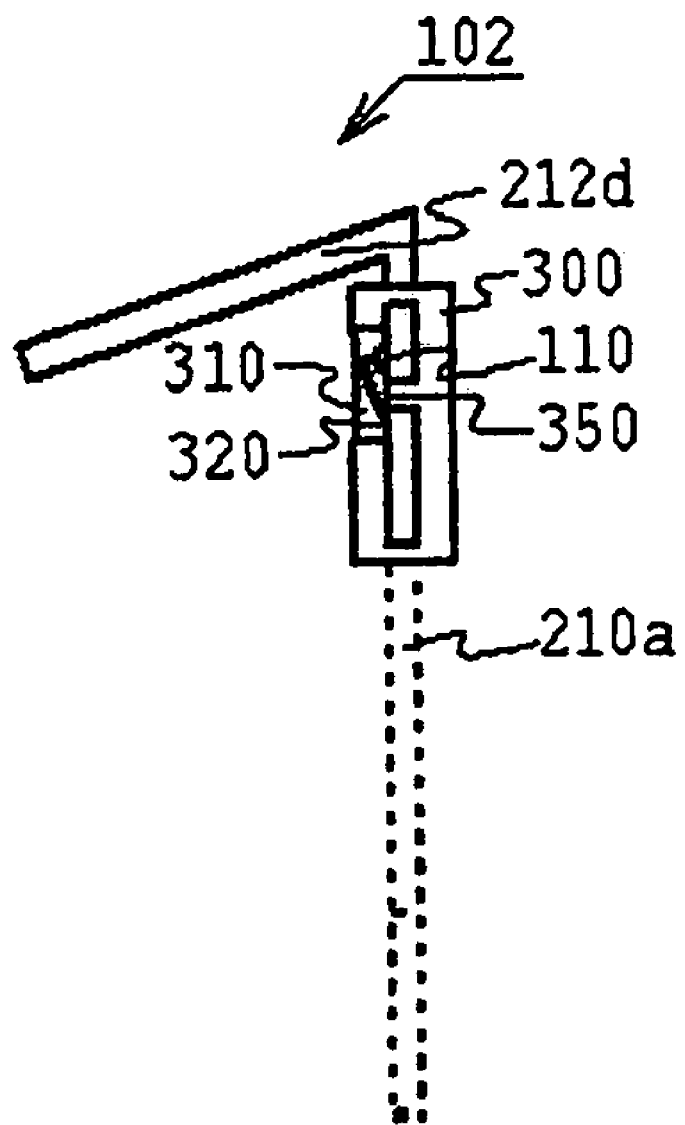
FIG. 8 is a schematic cross sectional view of a light-emitting device according to a fifth embodiment of the present invention.

Now, the description will be made for a light-emitting device according to the fifth embodiment with reference to the drawings attached hereto. FIG. 8 is a schematic cross sectional view illustrating a light-emitting element of the fifth embodiment. The detailed description for the members, parts and the like equivalent or corresponding to those of the light-emitting element of the first embodiment will be omitted.

A light-emitting element 102 has a metallic part 212d bent at an acute angle, thereby allowing the light-emitting element 102 to be easily attached to the light-guiding member therethrough even if an attaching portion of the light-guiding member has a different shape.

Sixth Embodiment

Figure 9:
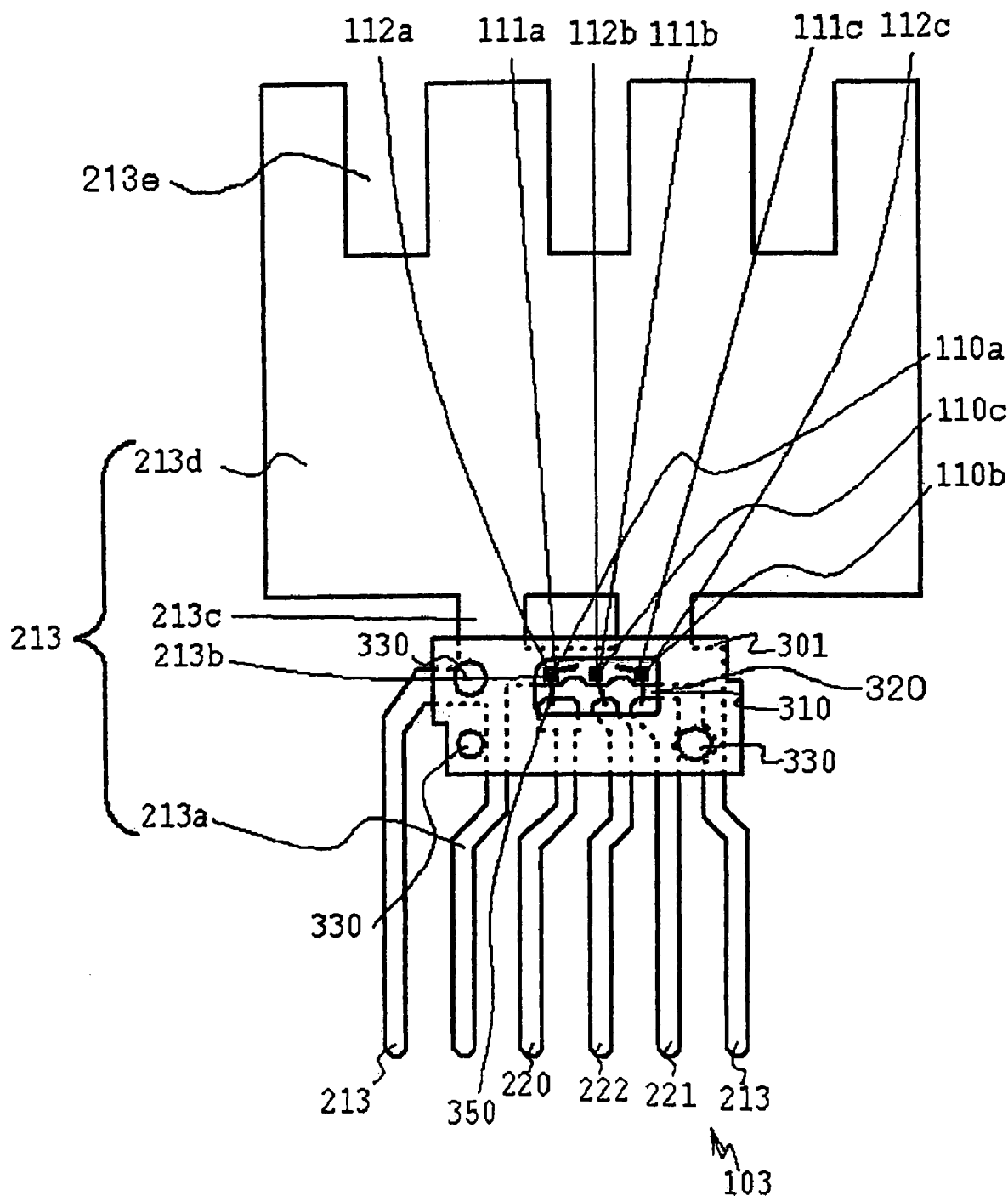
FIG. 9 is a schematic top view of a light-emitting element according to a sixth embodiment of the present invention.

Now, the description will be made for a light-emitting element according to the sixth embodiment with reference to the drawings attached hereto. FIG. 9 is a schematic plan view illustrating the light-emitting element of the sixth embodiment. The detailed description for the members, parts and the like equivalent or corresponding to those of the light-emitting element of the first embodiment will be omitted.

A light-emitting element 103 includes a first lead member 213, second lead members 220, 221, 222, and a molded member 301. The first lead member 213 has a lead terminal part 213a, a mounting part 213b, a connection part 213c and a metallic part 213d integrally formed in this order. It is not essential that only a single lead terminal part 213a is employed extends outwards, but it is possible to employ plural lead terminal parts, which extend from the mounting part 213b. Plural semiconductor light-emitting element chips 110a, 110b, 110c are mounted on the first lead member 213. Even in an arrangement with these plural chips mounted, the metallic part 213d makes it possible to prevent these chips from being broken or damaged by their heats. The metallic part 213d is provided with cutouts 213e for further improvement of the heat releasing capability.

The second lead members 220, 221, 222 are respectively connected to electrodes of the semiconductor light-emitting element chips 110a, 110b, 110c. The lead terminal parts of the plural first lead members 213, and the second lead members 220, 221, 222 are preferably arranged at equal intervals so that they can be plugged into a conventional power source without the necessity to modify the shape of the power source.

The molded member 301 has a window 310 in which the semiconductor light-emitting element chips 110a, 110b, 110c and wires are disposed. The molded member 301 has at its corners through-holes 330, through which the light-emitting element 103 can be securely attached to the light-guiding member.

It is possible to provide the light-emitting element 103 that makes an optimum RGB mixture to provide white light, by using a GaN compound semiconductor light-emitting element chip that emits blue light for the semiconductor light-emitting element chip 110a, a Gan compound semiconductor light-emitting element chip that emits green light for the semiconductor light-emitting element chip 110b, and a semiconductor light-emitting element chip that emits red light for the semiconductor light-emitting element chip 110c.

Seventh Embodiment

Figure 10:
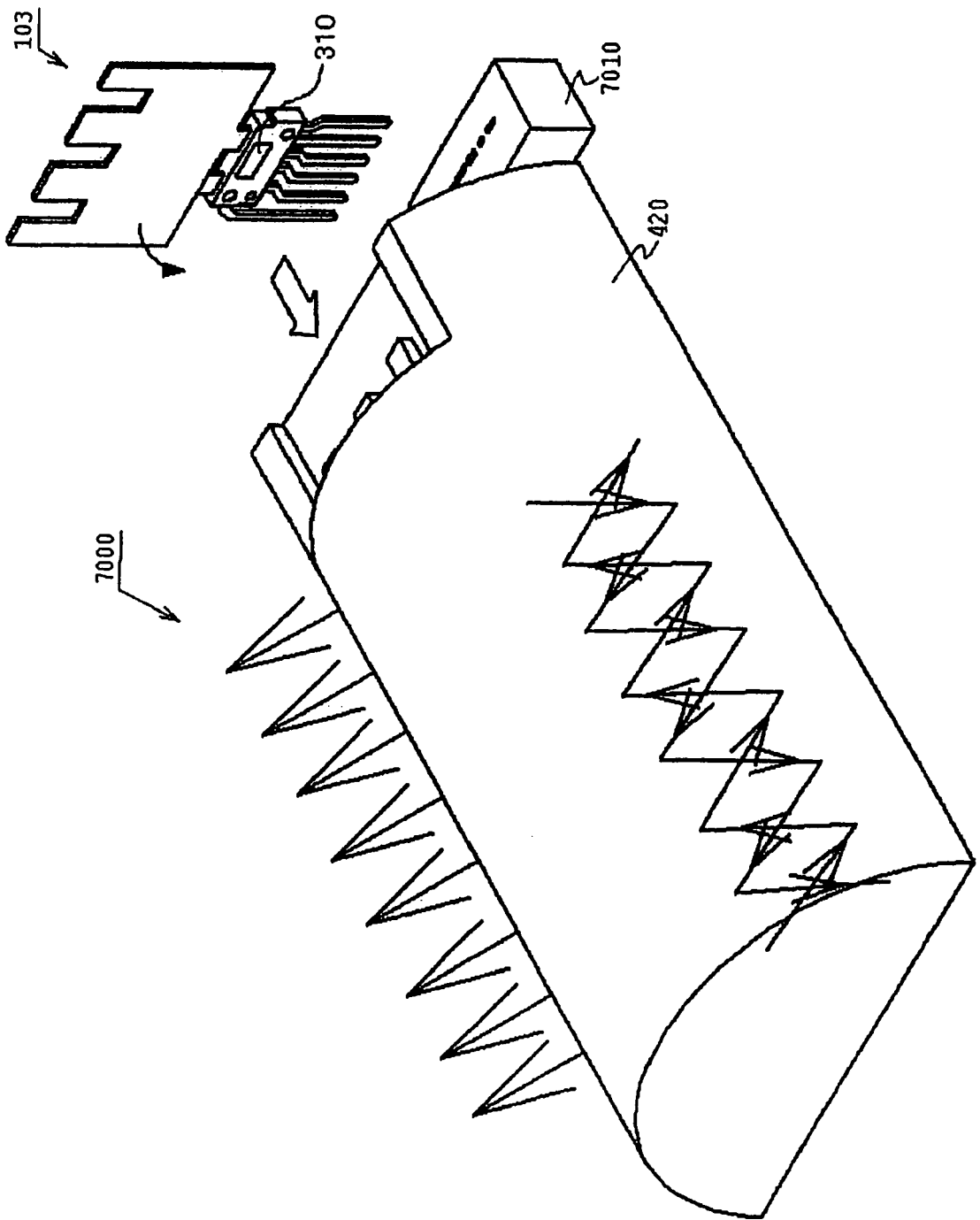
FIG. 10 is a schematic perspective view of a light-emitting device according to a seventh embodiment of the present invention.

Now, the description will be made for a light-emitting device according to the seventh embodiment with reference to the drawings attached hereto. FIG. 10 is a schematic perspective view illustrating the light-emitting device of the seventh embodiment. The detailed description for the members, parts and the like equivalent or corresponding to those of the light-emitting element of the first embodiment and the light-emitting element of the sixth embodiment will be omitted.

A light-emitting device 7000 of the seventh embodiment is made up by attaching the light-emitting element 103 of the sixth embodiment to a light-guiding member 420. The light-emitting device 7000 is designed to be plugged in a power source when in use.

The light-guiding member 420 is to transmit the light emitted from the light-emitting element 103 therethrough and emit the same in a given direction. Reflection and transmission of light are repeated inside of the light-guiding member 420 so that the light-guiding member 420 is substantially evenly illuminated throughout its length. Examples of materials, which can be used for the light-guiding member, include acrylate resin, polyamide resin, light transmitting resin of such as polymethyl methacrylate and polycarbonate, and glass.

In this embodiment, the light-emitting element 103 is attached to the light-guiding member 420 with the window 310 tightly contacting thereto. This is not essential for the present invention and therefore the window 310 may be located away from the light-guiding member 420. It is possible to adjust the amount of light to be guided to the light-guiding member based on the distance from the position of the window 310.

Eighth Embodiment

Figure 11:
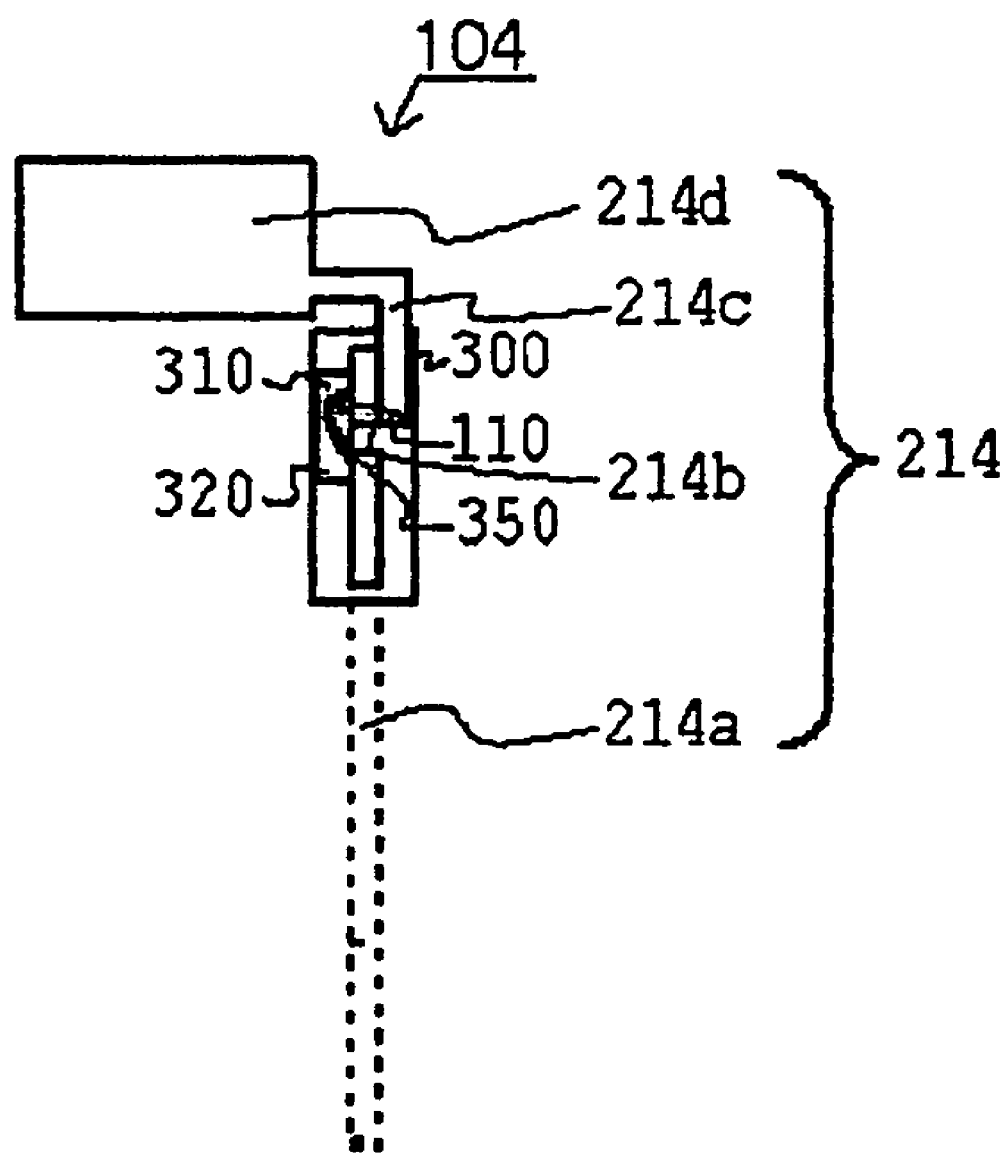
FIG. 11 is a schematic cross sectional view of a light-emitting device according to an eighth embodiment of the present invention.

Now, the description will be made for a light-emitting device according to the eighth embodiment with reference to the drawings attached hereto. FIG. 11 is a schematic cross sectional view illustrating the light-emitting device of the eighth embodiment. The detailed description for the members, parts and the like equivalent or corresponding to those of the light-emitting element of the first embodiment will be omitted.

A light-emitting element 104 has a first lead member 214 that is formed by an integral section comprising a lead terminal part 214a and a mounting part 214b and an integral section comprising a connection part 214c and a metallic part 214d, both sections being welded together or connected by any conventional techniques. The metallic part 214d has a thickness greater than the thickness of the connection part 214c. For ease of production of the metallic part 214d having a greater thickness, the integral section comprising the metallic part 214d and the connection part 214c is preferably made of a material different from the material of the integral section comprising the lead terminal part 214a and the mounting part 214b. The metallic part 214d having a greater thickness can enhance its heat releasing performance.

Ninth Embodiment

Figure 12:
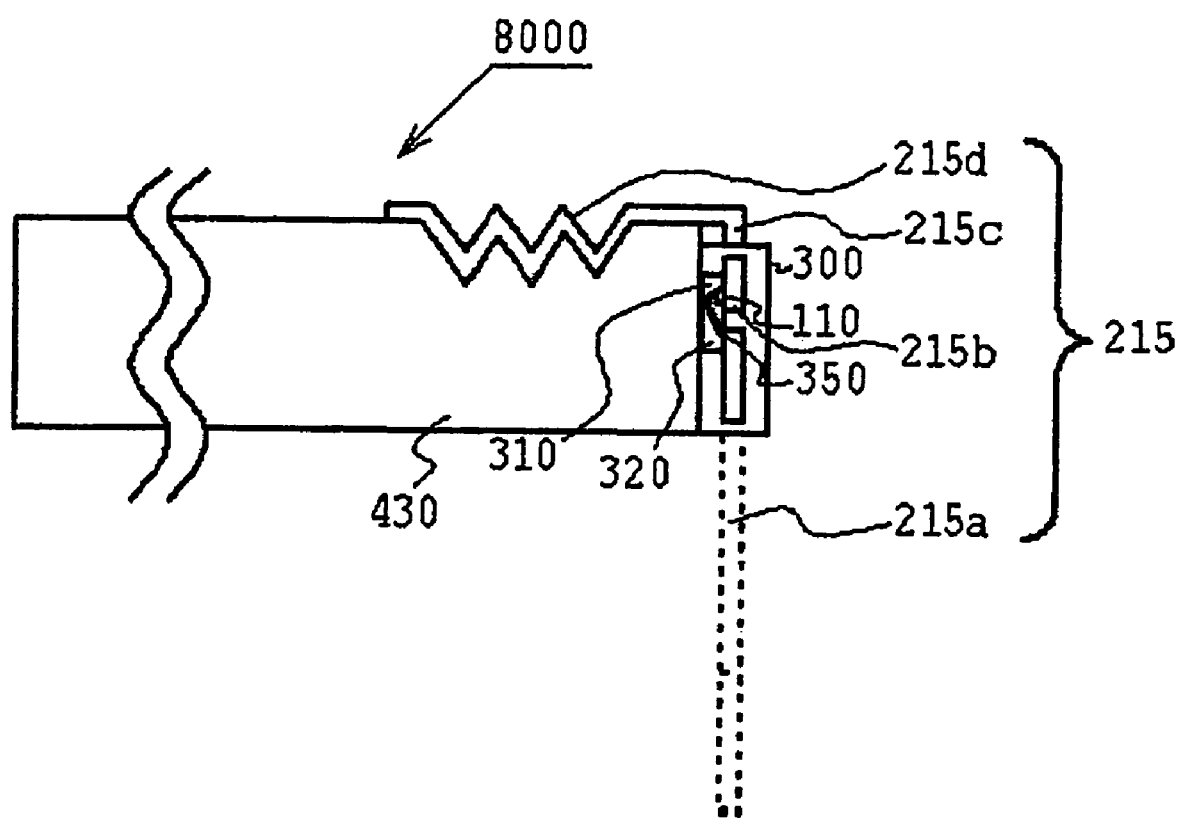
FIG. 12 is a schematic cross sectional view of a light-emitting device according to a ninth embodiment of the present invention.

Now, the description will be made for a light-emitting device according to the ninth embodiment with reference to the drawings attached hereto. FIG. 12 is a schematic cross sectional view illustrating the light-emitting device of the ninth embodiment. The detailed description for the members, parts and the like equivalent or corresponding to those of the light-emitting element of the first embodiment will be omitted.

A light-emitting element 105 has a first lead member 215 with a metallic part 215d bent in wave shape. This wave-shaped metallic part 215d has an enlarged surface area in its certain region for enhanced heat releasing performance. A light-guiding member 430 has cutouts to conform in shape with the wave-shaped metallic part 215d, thereby allowing itself to more tightly contact the metallic part 215d and hence to be more rigidly attached to the same.

In each of the light-emitting devices respectively illustrated in FIGS. 10 and 12, a portion of the light-guiding member other than an emission surface thereof may be covered by an enclosure. In this arrangement, it is possible to further improve light emission efficiency by employing an enclosure made of a material having high reflection efficiency for covering the light-guiding member. It is also possible to reduce the size of the light-emitting device by bending the metallic part, allowing the same to be held in contact with at least a part of the enclosure or the light-guiding member.

Tenth Embodiment

Figure 13:
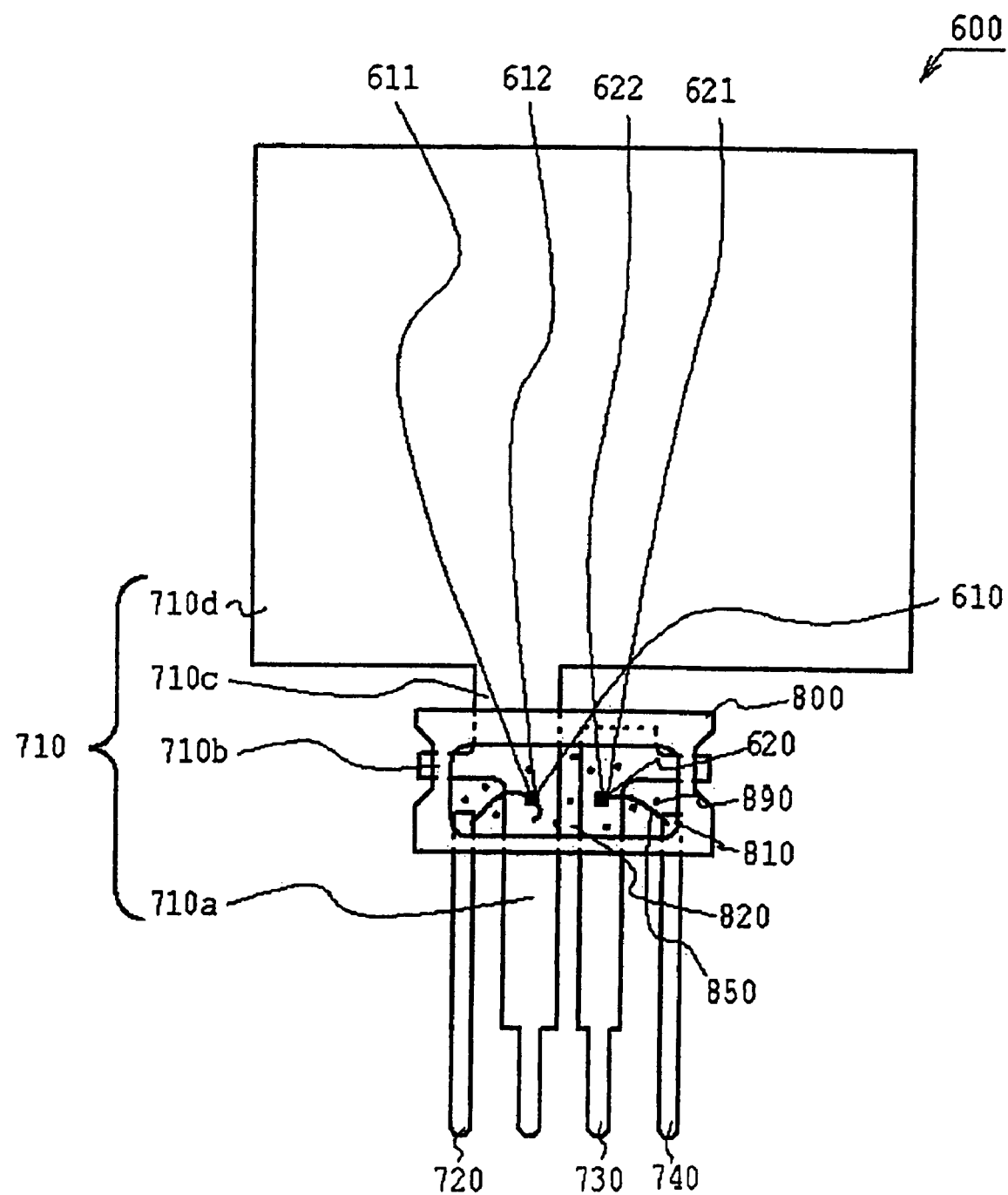
FIG. 13 is a schematic plan view of a light-emitting element according to a tenth embodiment of the present invention.

Now, the description will be made for a light-emitting element according to the tenth embodiment with reference to the drawings attached hereto. FIG. 13 is a schematic plan view illustrating the light-emitting element of the tenth embodiment. The detailed description for the members, parts and the like equivalent or corresponding to those of the light-emitting element of the first embodiment will be omitted.

A light-emitting element 600 of the tenth embodiment includes a first semiconductor light-emitting element chip 610, a second semiconductor light-emitting element chip 620, a first lead member 710, a second lead member 720, a third lead member 730, a fourth lead member 740, and a molded member 800 on which these members are fixedly mounted. The first semiconductor light-emitting element chip 610 has a peak wavelength in a short wavelength range of the visible spectrum. The second semiconductor light-emitting element chip 620 has a peak wavelength in a long wavelength range of the visible spectrum. It is to be noted that the peak wavelength of the second semiconductor light-emitting element chip 620 is not necessarily longer than a certain wavelength, provided that it lies in a wavelength range longer than the peak wavelength of the first semiconductor light-emitting element chip 610. The first semiconductor light-emitting element chip 610 is mounted on the first lead member 710 and has a first electrode 611 that is electrically connected thereto. The second lead member 720 is electrically connected to a second electrode 612 of the first semiconductor light-emitting element chip 610. The second semiconductor light-emitting element chip 620 is mounted on the third lead member 730 and has a first electrode 621 that is electrically connected thereto. The fourth lead member 740 is electrically connected to a second electrode 622 of the first semiconductor light-emitting element chip 620.

The first lead member 710 includes a lead terminal part 710*a* for electrical connection to an outside electrode, a mounting part 710*b* for mounting thereon the first semiconductor light-emitting element chip 610, a metallic part 710*d* extending outwards from the molded member 800 and a connection part 710*c* for connection between the metallic part 710*d* and the mounting part 710*b*. The lead terminal part 710*a* and the metallic part 710*d* oppositely extend outwards from the molded member 800. The lead terminal part 710*a*, the mounting part 710*b*, the connection part 710*c* and the metallic part 710*d* in the first lead member 710 are arranged in this order. The lead terminal part 710*a*, which is formed integrally with the mounting part 710*b*, the connection part 710*c* and the metallic part 710*d* in this embodiment, may be formed separately therefrom and combined together when in use. The width of the connection part 710*c*, which is smaller than the width of the metallic part 710*d*, may be sized to be substantially equal to the same with a clearance or cutout therebetween. The connection part 710*c* preferably has at least a portion disposed outside of the molded member 800. With this, the connection part 710*c* has a portion exposed from the molded member 800, which can be bent to be inclined. The metallic part 710*d* has a surface area larger than the surface area of the molded member 800. By this surface area is meant a dimension or size of the surface when the metallic part 710*d* and the molded member 800 are seen as a whole, without taking into account a small surface roughness or unevenness. The first lead member 710 may be made of a metallic material of copper, silver, gold, aluminium or an alloy thereof. It is preferable to use copper or an alloy containing copper as a main component. The first lead member 710 or other members may be plated.

The third lead member 730 includes a lead terminal part and a mounting part, on which the second semiconductor light-emitting element chip 620 is mounted. Since the second semiconductor light-emitting element chip 620 has heat output lower than that of the first semiconductor light-emitting element chip 610 when power on, it is not necessary to provide the metallic part 710*d* to the first lead member 710. Also, the arrangement with the first semiconductor light-emitting element chip 610 and the second semiconductor light-emitting element chip 620 separately mounted on the different lead members prevents heat output of the first semiconductor light-emitting element chip 610 from being directly conducted to the second semiconductor light-emitting element chip 620. The second semiconductor light-emitting element chip 620 is secured to the third lead member 730 by a die bonding material containing silver filler. The second semiconductor light-emitting element chip 620 has a pair of positive and negative electrodes respectively on the front and back sides, and the second electrode 622 of the second semiconductor light-emitting element chip 620 is electrically connected to the fourth lead member 740 by wire 850.

The molded member 800 has a window 810 for extraction of light from the first semiconductor light-emitting element chip 610 and the second semiconductor light-emitting element chip 620.

It is possible to provide the light-emitting element 600 that provides white light, for example, by using a GaN compound semiconductor light-emitting element chip that emits blue light for the first semiconductor light-emitting element chip 610, a semiconductor light-emitting element chip that emits red light for the second semiconductor light-emitting element chip 620, and a fluorescent material 890 that emits yellow light in a seal member 820.

Eleventh Embodiment

Figure 14:
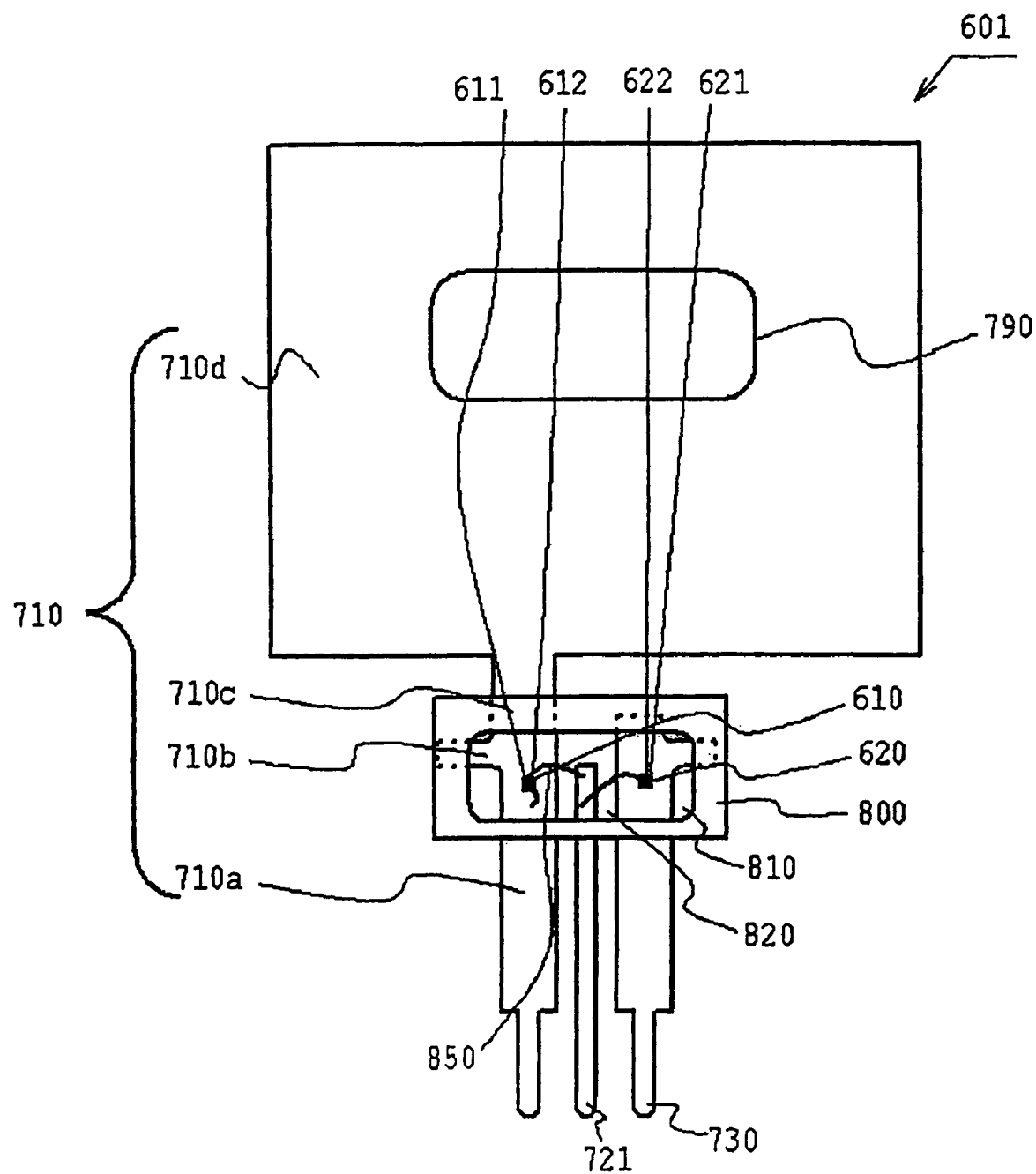
FIG. 14 is a schematic plan view of a light-emitting element according to an eleventh embodiment of the present invention.

Now, the description will be made for a light-emitting element according to the eleventh embodiment with reference to the drawings attached hereto. FIG. 14 is a schematic plan view illustrating the light-emitting element of the eleventh embodiment. The detailed description for the members, parts and the like equivalent or corresponding to those of the light-emitting element of the tenth embodiment will be omitted.

A light-emitting element 601 includes the first lead member 710, the second lead member 721, the third lead member 730 and the molded member 800 on which these lead members are fixedly mounted. The second lead member 721 is designed to solely perform the functions, which are achievable by both the second lead member 720 and the fourth lead member 740, of the tenth embodiment. The second lead member 721 provides connection between the second electrode 612 of the first semiconductor light-emitting element chip 610 and the second electrode 622 of the second semiconductor light-emitting element chip 620. The metallic part 710*d* has a mounting part 790, through which it is attached to a light-guiding member. The mounting part 790 is formed by providing a through-hole in the metallic part 710*d*. The reduction of the number of lead members provides a simplified circuit structure, as well as the light-emitting element 601 of a reduced size. The mounting portion 790 formed in the metallic part 710*d* makes it easier to mount the light-emitting element 601 to the light-guiding member as well as providing a tighter connection therebetween. The mounting portion may have various shapes such as an elliptical, rounded, rectangular or starburst shape, as well as plural mounting portions may be provided.

Twelfth Embodiment

Figure 15:
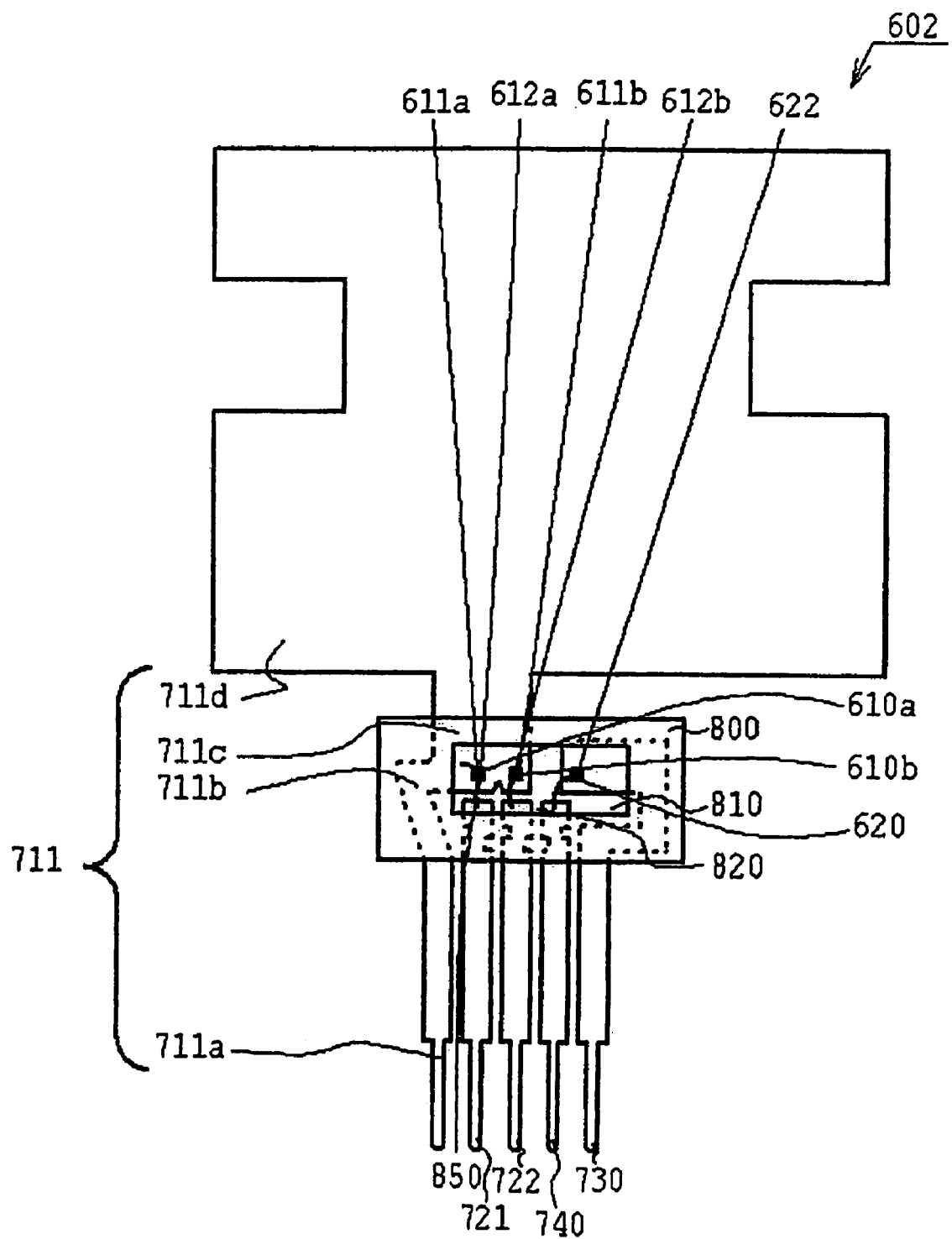
FIG. 15 is a schematic plan view of a light-emitting element according to a twelfth embodiment of the present invention.

Now, the description will be made for a light-emitting element according to the twelfth embodiment with reference to the drawings attached hereto. FIG. 15 is a schematic plan view illustrating the light-emitting element of the twelfth embodiment. The detailed description for the members, parts and the like equivalent or corresponding to those of the light-emitting element of the tenth embodiment will be omitted.

A light-emitting element 602 of the twelfth embodiment includes first semiconductor light-emitting element chips 610*a*, 610*b*, the second semiconductor light-emitting element chip 620, a first lead member 711, second lead members 721, 722, the third lead member 730, the fourth lead member 740, and the molded member 800 on which these lead members are fixedly mounted. The first lead member 711 mounts thereon the two chips, namely the first semiconductor light-emitting element chips 610*a*, 610*b*. One of the first semiconductor light-emitting element chips 610*a* has a pair of positive and negative electrodes, namely a first electrode 611*a* and a second electrode 612*a*, which are respectively electrically connected to the first lead member 711 and the second lead member 721. Another one of the first semiconductor light-emitting element chips 610*b* also has a pair of positive and negative electrodes, namely a first electrode 611*b* and a second electrode 612*b*, which are respectively electrically connected to the first lead member 711 and the second lead member 722. Those semiconductor light-emitting element chips having higher heat output are mounted on the first lead member 711. The first lead member 711 has a metallic part 711*d* with cutouts formed at the opposite lateral sides thereof. The first lead member 711, the fourth lead member 740, and those members located therebetween have recesses for producing an anchoring effect, preventing themselves from being pulled out of or separated from the molded member 800.

It is possible to provide the light-emitting element 602 that provides white light, for example, by using a GaN compound semiconductor light-emitting element chip that emits blue light for the first semiconductor light-emitting element chip 610*a*, a GaN compound semiconductor light-emitting element chip that emits green light for the first semiconductor light-emitting element chip 610*b*, and a semiconductor light-emitting element chip that emits red light for the second semiconductor light-emitting element chip 620. The first semiconductor light-emitting element chips 610*a*, 610*b*, which have high heat outputs when power on, are mounted on the first lead member 711 having the metallic part 711 for heat releasing. Whereby, it is possible to allow the light-emitting element 602 to provide white light, enhance the heat releasing performance and prevent the second semiconductor light-emitting element chip 620 from deteriorating due to heat.

As an alternative to the separately arranged second lead members 721, 722, and fourth lead member 740, a unified common lead member may be employed.

Thirteenth Embodiment

Figure 16:
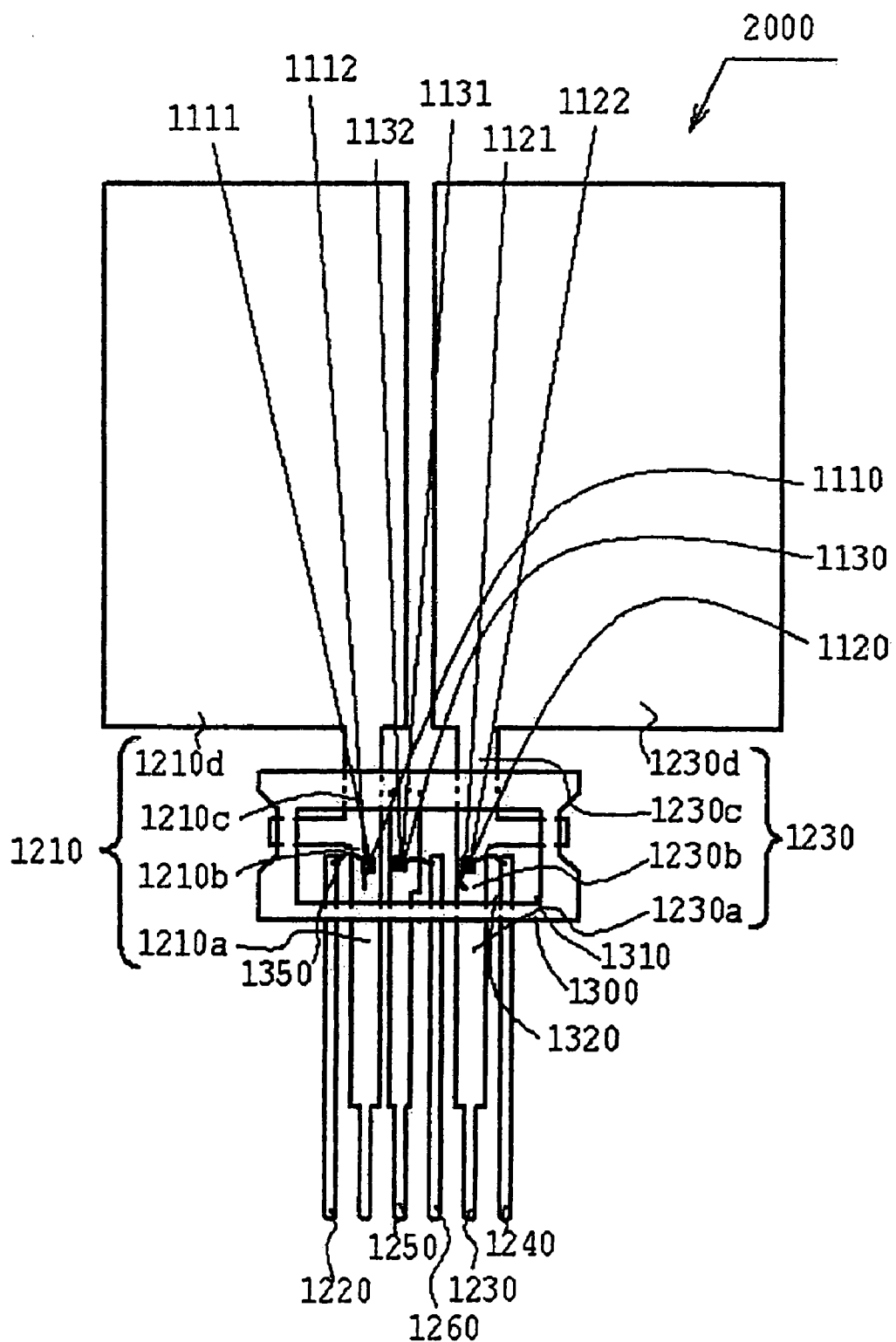
FIG. 16 is a schematic plan view of a light-emitting element according to a thirteenth embodiment of the present invention.

Now, the description will be made for a light-emitting element according to the thirteenth embodiment with reference to the drawings attached hereto. FIG. 16 is a schematic plan view illustrating the light-emitting element of the thirteenth embodiment. The detailed description for the members, parts and the like equivalent or corresponding to those of the light-emitting element of the first embodiment will be omitted.

A light-emitting element 2000 of the thirteenth embodiment includes a first semiconductor light-emitting element chip 1110, a second semiconductor light-emitting element chip 1120, a third semiconductor light-emitting element chip 1130, a first lead member 1210, a second lead member 1220, a third lead member 1230, a fourth lead member 1240, a fifth lead member 1250, a sixth lead member 1260, and a molded member 1300 on which the first to sixth lead members 1210-1260 are fixedly mounted. The first semiconductor light-emitting element chip 1110 has a peak wavelength in a short wavelength range of the visible spectrum. The second semiconductor light-emitting element chip 1120 has a peak wavelength in a wavelength range longer than the peak wavelength of the first semiconductor light-emitting element chip 1110. The third semiconductor light-emitting element chip 1130 has a peak wavelength in a wavelength range longer than the peak wavelength of the second semiconductor light-emitting element chip 1120. The first semiconductor light-emitting element chip 1110 is mounted on the first lead member 1210 and has a first electrode 1111, through which it is electrically connected to the first lead member 1210 by wire 1350. The first semiconductor light-emitting element chip 1110 also has a second electrode 1112, through which it is electrically connected to the second lead member 1220 by the wire 1350. Likewise, the second semiconductor light-emitting element chip 1120 is mounted on the third lead member 1230 and has a first electrode 1121, through which it is electrically connected to the third lead member 1230 by the wire 1350. The second semiconductor light-emitting element chip 1120 also has a second electrode 1122, through which it is electrically connected to the fourth lead member 1240 by the wire 1350. The third semiconductor light-emitting element chip 1130 is mounted on the fifth lead member 1250 and has a first electrode 1131, through which it is electrically connected to the first electrode 1131. The third semiconductor light-emitting element chip 1130 also has a second electrode 1132, through which it is electrically connected to the sixth lead member 1260 by the wire 1350.

The first lead member 1210 includes a lead terminal part 1210*a* for electrical connection to an outside electrode, a mounting part 1210*b* for mounting thereon the first semiconductor light-emitting element chip 1110, a metallic part 1210*d* extending outwards from the molded member 1300 and a connection part 1210*c* for connection between the metallic part 1210*d* and the mounting part 1210*b*. The lead terminal part 1210*a* and the metallic part 1210*d* oppositely extend outwards from the molded member 1300. The lead terminal part 1210*a*, the mounting part 1210*b*, the connection part 1210*c* and the metallic part 1210*d* in the first lead member 1210 are arranged in this order. The lead terminal part 1210*a*, which is formed integrally with the mounting part 1210*b*, the connection part 1210*c* and the metallic part 1210*d* in this embodiment, may be formed separately therefrom and combined together when in use. The width of the connection part 1210*c*, which is smaller than the width of the metallic part 1210*d*, may be sized to be substantially equal to the same with a clearance or cutout therebetween. The connection part 1210*c* preferably has at least a portion disposed outside of the molded member 1300. The metallic part 1210*d* has a surface area larger than the surface area of the molded member 1300. The metallic part 1210*d* is preferably made of copper or an alloy containing copper as a main component, while it is possible to use silver, gold, aluminium, iron or an alloy thereof. The metallic part 1210*d* may be made up of plural metal layers, such as with a reflection member of silver or aluminium formed on a copper layer. The reflection member may be formed on the copper layer by plating. The metallic part 1210*d* having a rectangular shape in this embodiment may be formed into a different shape for easy mounting to a light-guiding member. The first lead member 1210 may have a recess for producing an anchoring effect, preventing itself from being pulled out of or separated from the molded member 1300.

The third lead member 1230 has a structure similar to the first lead member 1210. Specifically, the third lead member 1230 includes a lead terminal part 1220*a* for electrical connection to an outside electrode, a mounting part 1230*b* for mounting thereon the second semiconductor light-emitting element chip 1120, a metallic part 1230*d* extending outwards from the molded member 1300 and a connection part 1230*c* for connection between the metallic part 1230*d* and the mounting part 1230*b*. The lead terminal part 1230*a* and the metallic part 1230*d* oppositely extend outwards from the molded member 1300. The lead terminal part 1230*a*, the mounting part 1230*b*, the connection part 1230*c* and the metallic part 1230*d* in the third lead member 1230 are arranged in this order. The lead terminal part 1230a, which is formed integrally with the mounting part 1230b, the connection part 1230c and the metallic part 1230d in this embodiment, may be formed separately therefrom and combined together when in use. The width of the connection part 1230c, which is smaller than the width of the metallic part 1230d, may be sized to be substantially equal to the same with a clearance or cutout therebetween. The connection part 1230c preferably has at least a portion disposed outside of the molded member 1300. The metallic part 1230d has a surface area larger than the surface area of the molded member 1300. The metallic part 1230d is preferably made of copper or an alloy containing copper as a main component, while it is possible to use silver, gold, aluminium, iron or an alloy thereof. The metallic part 1230d may be made up of plural metal layers, such as with a reflection member of silver or aluminium formed on a copper layer. The reflection member may be formed on the copper layer by plating. The metallic part 1230d having a rectangular shape in this embodiment may be formed into a different shape for easy mounting to a light-guiding member. The third lead member 1230 may have a recess for producing an anchoring effect, preventing itself from being pulled out of or separated from the molded member 1300.

The fifth lead member 1250 includes a lead terminal part for electrical connection to an outside electrode, and a mounting part for mounting thereon the third semiconductor light-emitting element chip 1130.

The metallic part 1210d of the first lead member 1210 and the metallic part 1230d of the third lead member 1230 each may be formed into a given shape before it has been secured in position by the molded member 1300, or instead, may be cut out into a given shape after it has been secured in position by the molded member 1300.

The molded member 1300 has a window 1310 for extraction of light from the first semiconductor light-emitting element chip 1110, the second semiconductor light-emitting element chip 1120 and the third semiconductor light-emitting element chip 1130. A seal member 1320 is filled in the window 1310 so as to protect the first semiconductor light-emitting element chip 1110, the second semiconductor light-emitting element chip 1120 and the third semiconductor light-emitting element chip 1130 from any foreign matters or external environment.

It is possible to provide the light-emitting element 2000 that makes an optimum RGB mixture to provide white light, by using a GaN compound semiconductor light-emitting element chip that emits blue light for the first semiconductor light-emitting element chip 1110, a GaN compound semiconductor light-emitting element chip that emits green light for the second semiconductor light-emitting element chip 1120, and a semiconductor light-emitting element chip that emits red light for the third semiconductor light-emitting element chip 1130. The first metallic part 1210d for heat release, which is provided to the first lead member 1210, can efficiently release heat generated from the first semiconductor light-emitting element chip 1110, which has a high heat output when power on. Likewise, the second metallic part 1230d for heat release, which is provided to the third lead member 1230, can efficiently release heat generated from the second semiconductor light-emitting element chip 1120, which has a high heat output when power on. Since the third semiconductor light-emitting element chip 1130 is mounted on the fifth lead member 1250, which is away from the lead members on which the first semiconductor light-emitting element chip 1110 and the second semiconductor light-emitting element chip 1120 are respectively mounted, it is possible to reduce the possibility that the third semiconductor light-emitting element chip 1130 is destroyed due to heat from these other chips.

The lead terminal parts of the first to sixth lead members 1210-1260 for connection to the outside terminals are preferably disposed at equal intervals. The first to sixth lead members 1210-1260 secured by the molded member 1300 each may have a given recess or protrusion so as to produce an anchoring effect.

Fourteenth Embodiment

Figure 17:
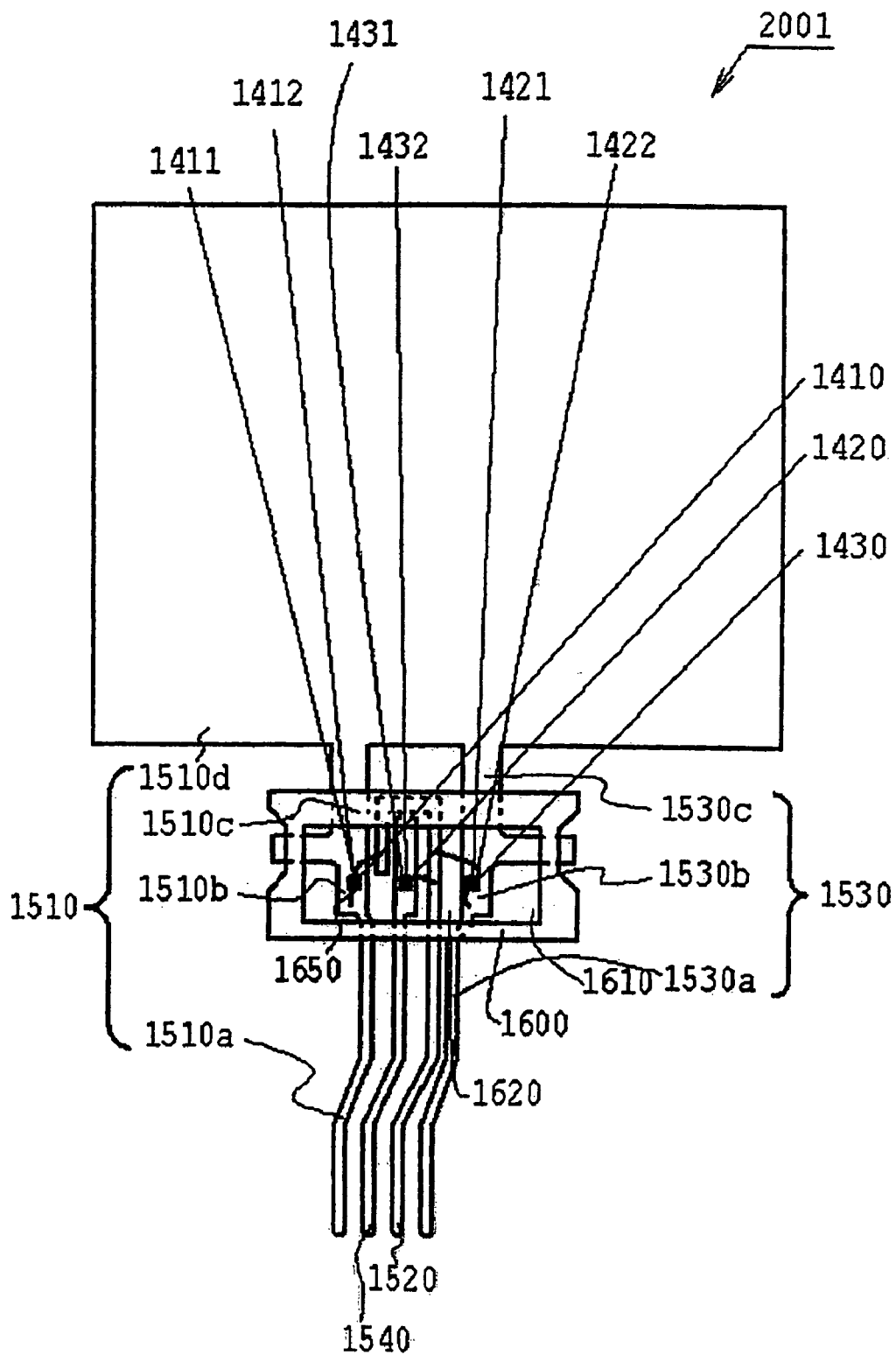
FIG. 17 is a schematic plan view of a light-emitting element according to a fourteenth embodiment of the present invention.

Now, the description will be made for a light-emitting element according to the fourteenth embodiment with reference to the drawings attached hereto. FIG. 17 is a schematic plan view illustrating the light-emitting element of the fourteenth embodiment. The detailed description for the members, parts and the like equivalent or corresponding to those of the light-emitting element of the thirteenth embodiment will be omitted.

A light-emitting element 2001 of the fourteenth embodiment includes a first semiconductor light-emitting element chip 1410, a second semiconductor light-emitting element chip 1420, a third semiconductor light-emitting element chip 1430, a first lead member 1510, a second lead member 1520, a third lead member 1530, a fourth lead member 1540, and a molded member 1600 on which these members are fixedly mounted. The second lead member 1520 is designed to solely perform the functions, which are achievable by the second lead member 1220, the fourth lead member 1240 and the sixth lead member 1260, of the thirteenth embodiment. The second lead member 1520 provides electrical connection for three electrodes, namely a second electrode 1412 of the first semiconductor light-emitting element chip 1410, a second electrode 1422 of the second semiconductor light-emitting element chip 1420 and a second electrode 1432 of the third semiconductor light-emitting element chip 1430. On the other hand, a metallic part 1510d of the first lead member 1510 is formed integrally with a metallic part of the third lead member 1530, thereby allowing the first lead member 1510 to be rigidly secured to the third lead member 1530. It is possible to use a GaN compound semiconductor that emits blue light for the first semiconductor light-emitting element chip 1410, a GaN compound semiconductor that emits green light for the second semiconductor light-emitting element chip 1420, and a compound semiconductor that emits red light for the third semiconductor light-emitting element chip 1430, respectively, while it is also possible to use a different combination. A protective element (e.g., condensers, diodes, etc.) may be provided to protect the semiconductor light-emitting element chips from electrostatic discharge.

According to the mounting system of the light-emitting elements of the above embodiments, a compound semiconductor layer is deposited on a substrate to have a semiconductor light-emitting element chip, and the substrate is mounted on the lead members. As an alternative to this, it is possible to utilize a flip chip mounting system in which a substrate is placed face down on the lead members. For example, when using a semiconductor light-emitting element chip, in which an n-type layer and a p-type layer, of a GaN compound semiconductor are deposited in this order on a sapphire substrate, it is possible to extract light from the side of the sapphire substrate of the chip. This flip chip mounting system does not require wiring and is therefore unlikely to block light emitted from the semiconductor light-emitting element chip. Provided on the side of the compound semiconductor layers are positive and negative electrodes that are respectively electrically connected to the corresponding lead members via bump-bonding or the like. In this arrangement, an insulating material such as epoxy resin may be disposed between the compound semiconductor and the lead members, so that the heat releasing performance can be more enhanced than in the arrangement without the insulating material. The semiconductor light-emitting element chip is mounted on two different lead members.

Figure 18:
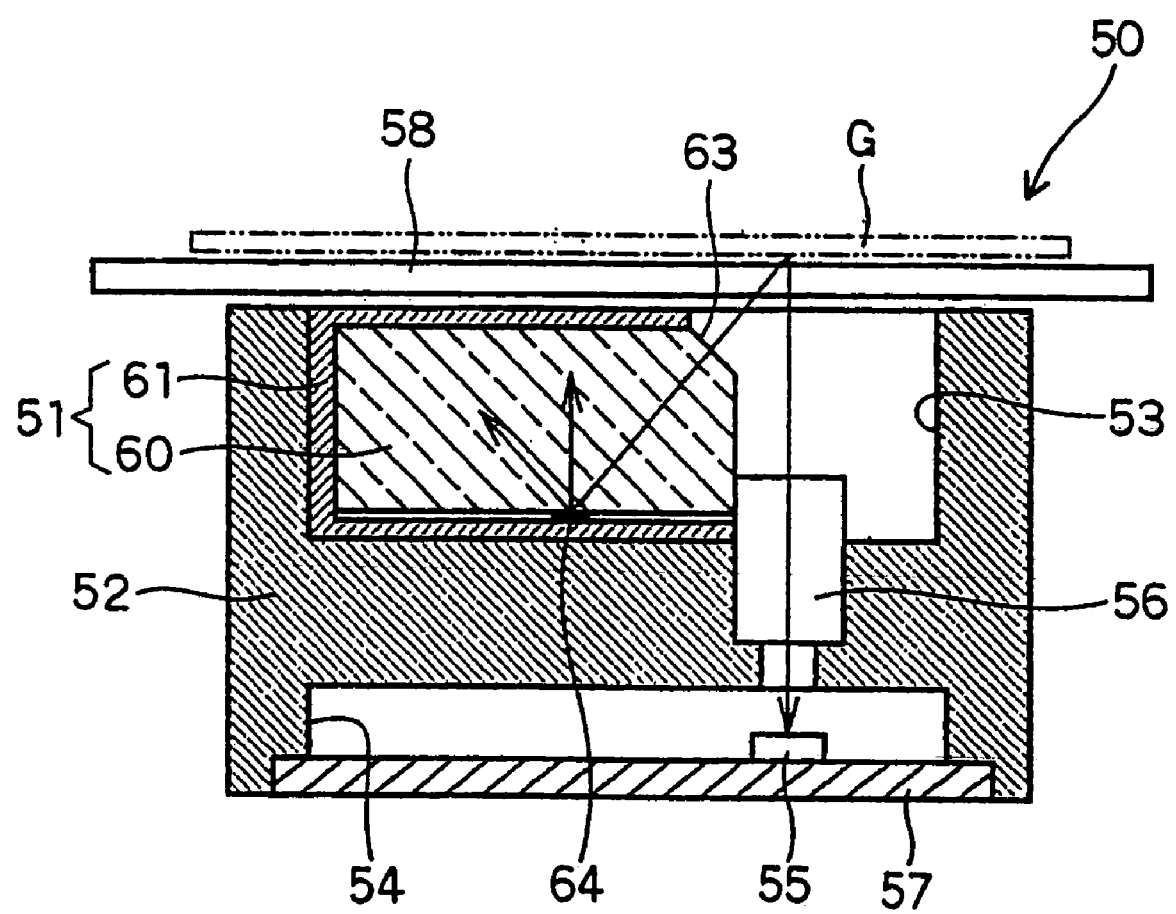
FIG. 18 is a schematic cross sectional view of an image reading apparatus of the present invention.

A light-emitting device of the present invention may be utilized for a line illumination device 51 as a light source of an image reading apparatus 50, as illustrated in FIG. 18. This image reading apparatus 50 has a frame (or an enclosure) with first and second recesses 53, 53 formed therein, in which the line illumination device 51 is disposed in the first recess 53 and a sensor board 56 equipped with a photo element 55 (or a line image sensor) is mounted in the second recess 54. Inside the frame 52 is held a lens array 57 for equal-magnification-image-forming that focuses light from the line illumination device 51 onto the photo element 55. A glass plate 58 is disposed on an upper part of the frame 52. A reference code G represents a document as a reading object.

The line illumination device 51 has a transparent light-guiding member 60 made of acrylic resin having a rod- or plate-like shape and a white casing 61 for mount of the light-guiding member 60. Light-emitting elements 62 as light sources are mounted to the opposite ends of the white casing 61. The transparent light-guiding member 60 has a substantially rectangular shape in cross section taken along a line orthogonal to a main scanning direction (a longitudinal direction) and edges of the transparent light-guiding member 60 each are C-chamfered, allowing the chamfered surfaces to act as emission surfaces 63. A light-scattering pattern 64 for scattering the incident light is formed on the back side of the transparent light-guiding member 60 by, for example, screen-printing with white paint. It is possible to employ an arrangement with one line illumination device 51 or an arrangement with two line illumination devices 51 disposed respectively on the right and left sides with the lens array 57 therebetween. It is possible to employ any one of the light-emitting elements of the aforesaid embodiments for the light-emitting element(s) 62 for use in the image reading apparatus 50. The light-emitting element 62 may be arranged at one end of the line illumination device 51.

Figure 19:
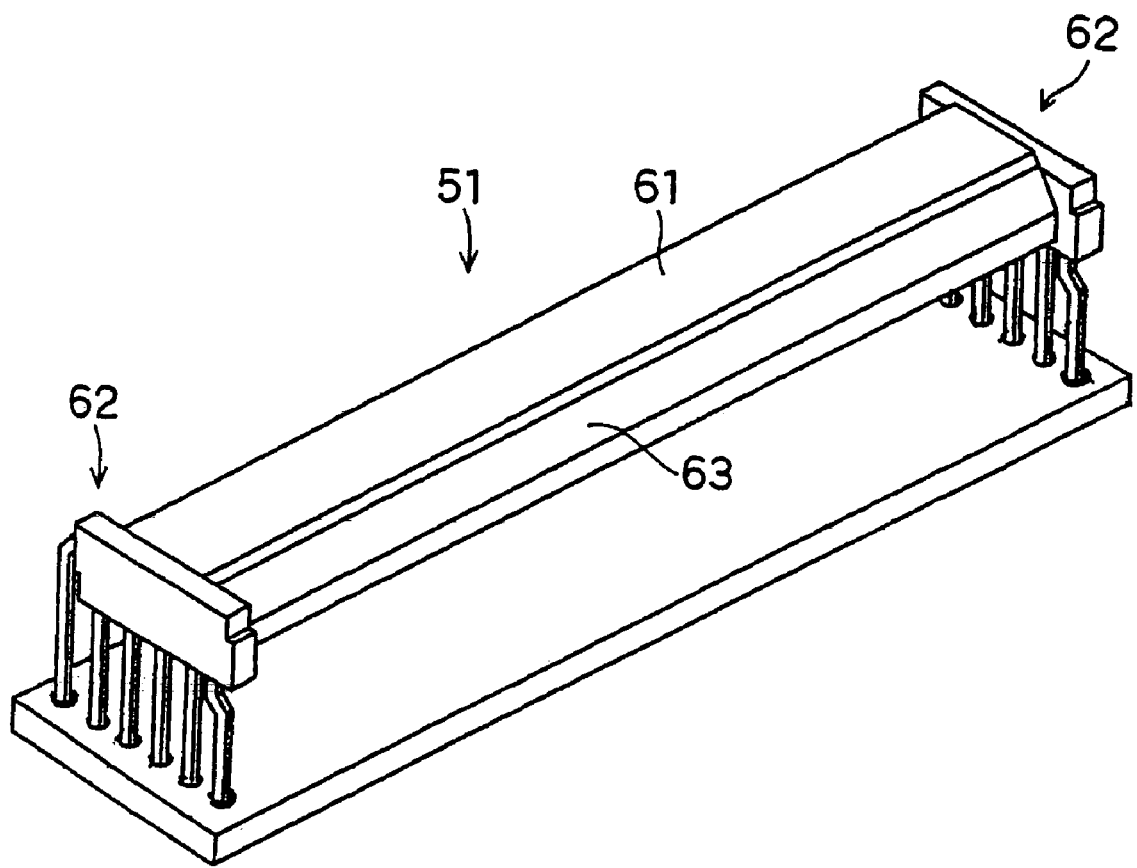
FIG. 19 is a perspective view of a line illumination device with a light-emitting device incorporated thereinto, of an image reading apparatus.
Figure 20:
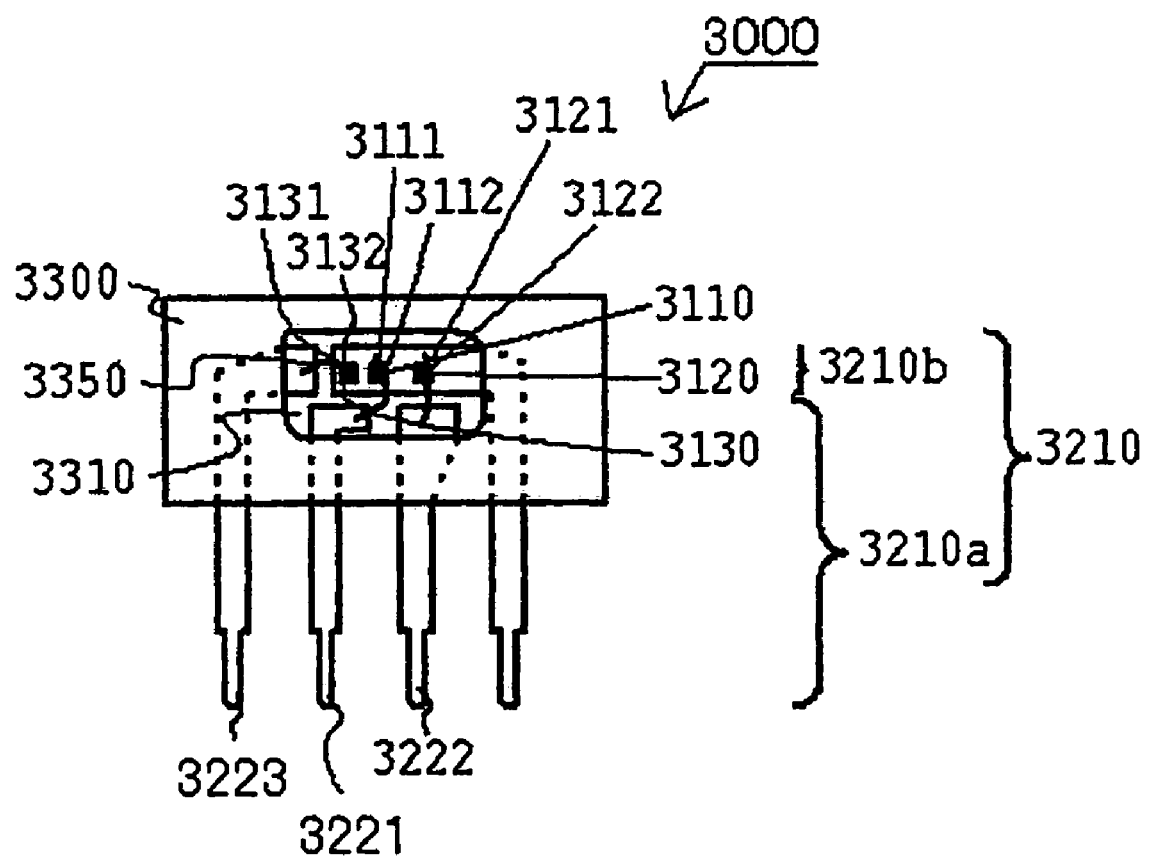
FIG. 20 is a schematic plan view of a conventional light-emitting element.

According to the image reading apparatus 50, light emitted from the emission surfaces 63 is irradiated on the document G through the glass plate 58, and reflected light from the document G is detected by the photo element 55 through the lens array 57 so that the document G is read out. An object region of the document G is read out by moving the frame 52 in a sub-scanning direction of FIG. 19 relative to the glass plate 58. Heat generated from the light-emitting element chip during this reading operation is efficiently released.

A light-emitting device of the present invention may be utilized as a light source for an illumination system, a backlight of a liquid crystal display device, etc., as well as the image reading apparatus.

EXAMPLES

Example 1

Now, the description will be made for a light-emitting element of the first example, in which the detailed description for the members, parts and the like equivalent or corresponding to those of the light-emitting element of the sixth embodiment will be omitted. FIG. 9 is a schematic plan view illustrating the light-emitting element of the first example.

The light-emitting element 103 includes the first lead member 213, the second lead members 220, 221, 222, and the molded member 301. The semiconductor light-emitting element chips 110a, 110b, 110c are mounted on the first lead member 213.

InGaN semiconductor, which has a peak wavelength within the range of about 440 nm to about 480 nm, is used for the semiconductor light-emitting element chip 110a. The semiconductor light-emitting element chip 110a emits blue light. The semiconductor light-emitting element chip 110a is mounted face up on the mounting part 213b of the first lead member 213 via epoxy resin.

InGaN semiconductor, which has a peak wavelength within the range of about 500 nm to about 540 nm, is used for the semiconductor light-emitting element chip 110b. The semiconductor light-emitting element chip 110b emits green light. The semiconductor light-emitting element chip 110b is mounted face up on the mounting part 213b of the first lead member 213 via epoxy resin.

GaAs semiconductor, which has a peak wavelength within the range of about 610 nm to about 700 nm, is used for the semiconductor light-emitting element chip 110c. The semiconductor light-emitting element chip 110c emits red light. The semiconductor light-emitting element chip 110c is mounted on the mounting part 213b of the first lead member 213 via epoxy resin with Ag filler mixed therein.

The molded member 301 is made of BT resin and has a length of about 4.0 mm, a width of about 9.0 mm and a thickness of about 1.5 mm. The window 310 has a length of about 1.6 mm and a width of about 3.6 mm. Silicone resin is provided in the window 310 to coat the semiconductor light-emitting element chips 110a, 110b, 110c. The through-holes are formed at given positions of the molded member 301. The first to third semiconductor light-emitting element chips 110a-110c are disposed in the window 310 substantially at equal intervals.

For the first lead member 213, and the second lead members 220, 221, 222, copper is used as a base material to have a substrate, on which nickel and silver are plated in this order. The first lead member 213 and the second lead members 220, 221, 222 each have a thickness of 0.4 mm, and formed by punching out a metal plate into a given shape by using a press machine. The first lead member 213 extending outwards from the molded member 301 acts as a cathode common electrode. The second lead members 220, 221, 222 act as anode electrodes. The lead terminal parts of the first lead member 213 and the second lead members 220, 221, 222 are positioned substantially at equal intervals. The metallic part 213d extending outwards from the molded member 301 has a length of about 20 mm and a width of about 18 mm, while being possible to be varied in size depending on the shape of a light-guiding member or the like.

The connection part 213c is bent to be substantially perpendicular to the window 320 and is attached to the light-guiding member 420 so as to fit the metallic part 210d of the light-emitting element 103 to the fitting part of the light-guiding member 420.

Thus, the light-emitting element 103 and the light-emitting device 7000 can be manufactured. It is possible to provide a light-emitting device, in which a mixed color emitted from the light-emitting element 103 is in a white range when power is supplied from the power source 7010 to the light-emitting device 7000.

This specification is by no means intended to restrict the present invention to the preferred embodiments set forth therein. Various modifications to the light emitting element and the light-emitting device, as described herein, may be made by those skilled in the art without departing from the spirit and scope of the present invention as defined in the appended claims.

What is claimed is:

1. A light-emitting device comprising:
   a light-emitting element; and
   a light-guiding member for guiding and emitting therethrough light emitted from the light-emitting element and incident thereon by reflecting or transmitting a portion of the incident light through the light-guiding member; wherein the light-emitting element comprises:
   a first semiconductor light-emitting element chip that has a peak wavelength in a short wavelength range of the visible spectrum and has a first electrode and a second electrode;
   a second semiconductor light-emitting element chip that has a peak wavelength in a long wavelength range of the visible spectrum and has a first electrode and a second electrode;
   a first lead member on which the first semiconductor light-emitting element chip is mounted, said first lead member electrically connected to the first electrode of the first semiconductor light-emitting element chip;
   a second lead member electrically connected to the second electrode of the first semiconductor light-emitting element chip;
   a third lead member on which the second semiconductor light-emitting element chip is mounted, said third lead member electrically connected to the first electrode of the second semiconductor light-emitting element chip;
   a fourth lead member electrically connected to the second electrode of the second semiconductor light-emitting element chip; and
   a molded member to which a portion of each of the first to fourth lead members is secured; wherein
   the first lead member has a lead terminal part for electrical connection to an outside electrode, a mounting part through which the first semiconductor light-emitting element chip is mounted on the first lead member, a metallic part for releasing heat generated from the first semiconductor light-emitting element chip, and a connection part for connection between the mounting part and the metallic part; wherein the first lead member is electrically conductive, further wherein the first lead member has the lead terminal part, the mounting part, the connection part, and the metallic part integrally formed with each other in this order, further wherein the lead terminal part and the metallic part oppositely extend outwards from the molded member, and
   the metallic part is exposed from the molded member and bent.

2. The light-emitting device according to claim 1, wherein the second lead member is formed integrally with the fourth lead member.

3. The light-emitting device according to claim 1, wherein the light-guiding member has a fitting part, into which at least a portion of the light-emitting element is fitted.

4. The light-emitting device according to claim 1, wherein the light-emitting element has a light extraction section extending at least partly over the first semiconductor light-emitting element chip and the second semiconductor light-emitting element chip so that light emitted from the first and second semiconductor light-emitting element chips is extracted through the light extraction section, and the light extraction section tightly contacts the light-guiding member.

5. The light-emitting device according to claim 1, further comprising a heat release member joined to the metallic part so that heat generated from the first semiconductor light-emitting element chip and the second semiconductor light-emitting element chip is transmitted from the metallic part to the heat release member.

6. The light-emitting device according to claim 1, wherein the light-emitting element is secured to the light-guiding member with the metallic part held in contact with the light-guiding member.

7. The light-emitting device according to claim 1, wherein the metallic part is held in contact with the light-guiding member and has a wave-shaped cross section.

8. An image reading apparatus comprising the light-emitting device according to claim 1, a line image sensor, and a lens array for focusing light from the light-emitting device, which light turns into reflection light or transmitted light from the reading object, onto the line image sensor.

9. A light-emitting device comprising:
   a light-emitting element; and
   a light-guiding member for guiding and emitting therethrough light emitted from the light-emitting element and incident thereon by reflecting or transmitting a portion of the incident light through the light-guiding member; the light-emitting element comprising:
   a first semiconductor light-emitting element chip that generates heat, and has a peak wavelength in a short wavelength range of the visible spectrum and has a first electrode and a second electrode, the first semiconductor light-emitting element chip mounted on a mounting part of a first lead member, the mounting part for conducting heat generated by the first semiconductor light-emitting element chip via a connection part to a metallic part for releasing the heat, the mounting part further for electrically connecting the first semiconductor light-emitting element chip via a lead terminal part to an outside electrode;
   a second semiconductor light-emitting element chip that has a peak wavelength in a long wavelength range of the visible spectrum and has a first electrode and a second electrode, the second semiconductor light-emitting element chip mounted on a third lead member separate from the first lead member, the heat generated by the first semiconductor light-emitting element chip conducted away from the second semiconductor light-emitting element chip through the mounting part, the connection part, and the metallic part that releases the heat to protect the second semiconductor light-emitting element chip from the heat generated by the first semiconductor light-emitting element chip;
   the first lead member on which the first semiconductor light-emitting element chip is mounted, said first lead member electrically connected to the first electrode of the first semiconductor light-emitting element chip, the first lead member having the mounting part for conducting heat generated by the first semiconductor light-emitting element chip via the connection part to the metallic part for releasing the heat;
   a second lead member electrically connected to the second electrode of the first semiconductor light-emitting element chip;
   the third lead member on which the second semiconductor light-emitting element chip is mounted, said third lead member electrically connected to the first electrode of the second semiconductor light-emitting element chip, the third lead member separate from the first lead member through which the heat generated by the first semiconductor light-emitting element chip is conducted away from the second semiconductor light-emitting element chip through the mounting part, the connection part, and the metallic part that releases the heat;

a fourth lead member electrically connected to the second electrode of the second semiconductor light-emitting element chip; and a molded member to which a portion of each of the first to fourth lead members is secured; wherein the metallic part is exposed from the molded member and bent.

10. The light-emitting device according to claim 9, wherein the light-emitting element has a light extraction section extending at least partly over the first semiconductor light-emitting element chip and the second semiconductor light-emitting element chip so that light emitted from the first and second semiconductor light-emitting element chips is extracted through the light extraction section, and the light extraction section tightly contacts the light-guiding member.

11. The light-emitting device according to claim 9, wherein the light-emitting element is secured to the light-guiding member with the metallic part held in contact with the light-guiding member.

* * * * *